US012622134B2

(12) United States Patent
Yamamoto et al.

(10) Patent No.: US 12,622,134 B2
(45) Date of Patent: May 5, 2026

(54) ORGANIC ELECTROLUMINESCENT DEVICE, AND ELECTRONIC APPARATUS

(71) Applicant: Hodogaya Chemical Co., Ltd., Tokyo (JP)

(72) Inventors: Takeshi Yamamoto, Tokyo (JP); Kouki Kase, Tokyo (JP); Eriko Chiba, Tokyo (JP); Yuta Hirayama, Tokyo (JP); Shuichi Hayashi, Tokyo (JP)

(73) Assignee: Hodogaya Chemical Co., Ltd., Tokyo (JP)

( * ) Notice: Subject to any disclaimer, the term of this patent is extended or adjusted under 35 U.S.C. 154(b) by 422 days.

(21) Appl. No.: 18/281,336

(22) PCT Filed: Mar. 9, 2022

(86) PCT No.: PCT/JP2022/010406
§ 371 (c)(1),
(2) Date: Sep. 11, 2023

(87) PCT Pub. No.: WO2022/191256
PCT Pub. Date: Sep. 15, 2022

(65) Prior Publication Data

US 2024/0179930 A1 May 30, 2024

(30) Foreign Application Priority Data

Mar. 12, 2021 (JP) ................................ 2021-039784

(51) Int. Cl.
*H10K 50/844* (2023.01)
*H10K 50/11* (2023.01)
(Continued)

(52) U.S. Cl.
CPC ........... *H10K 50/844* (2023.02); *H10K 50/11* (2023.02); *H10K 50/15* (2023.02); *H10K 50/16* (2023.02);
(Continued)

(58) Field of Classification Search
CPC .... H10K 50/844; H10K 85/636; H10K 50/16; H10K 50/11
(Continued)

(56) References Cited

U.S. PATENT DOCUMENTS 10,138,201 B2 * 11/2018 Kang ................ H10K 85/6572
2008/0125609 A1 5/2008 Vestweber et al.
(Continued)

FOREIGN PATENT DOCUMENTS

CN 111869326 A 10/2020
JP 2021-508729 A 3/2021
(Continued)

OTHER PUBLICATIONS

The Office Action mailed Jun. 9, 2025, issued for the corresponding Taiwan patent application No. is 111108924.

*Primary Examiner* — Ori Nadav
(74) *Attorney, Agent, or Firm* — Troutman Pepper Locke LLP

(57) ABSTRACT

An object of the present invention is to provide a compound with a high refractive index and a low extinction coefficient at a wavelength in range of 450 nm to 750 nm in a capping layer to improve light extraction efficiency of an organic electroluminescent device. The present invention was achieved by focusing on the fact that a specific arylamine based compound has excellent thin film stability and durability and is able improve the refractive index by adjusting the molecular structures, and planning molecule, and an organic electroluminescent device having excellent luminous efficiency was obtained by using this compound as a material for constituting a capping layer.

20 Claims, 17 Drawing Sheets

(51) Int. Cl.
*H10K 50/15* (2023.01)
*H10K 50/16* (2023.01)
*H10K 50/85* (2023.01)
*H10K 85/60* (2023.01)

(52) U.S. Cl.
CPC ........... *H10K 50/85* (2023.02); *H10K 85/636* (2023.02); *H10K 85/6576* (2023.02)

(58) Field of Classification Search
USPC ............................................................ 257/40
See application file for complete search history.

(56) References Cited

U.S. PATENT DOCUMENTS

| | | | |
|---|---|---|---|
| 2020/0395549 | A1 | 12/2020 | Kase et al. |
| 2021/0053954 | A1 | 2/2021 | Sun et al. |
| 2022/0017503 | A1 | 1/2022 | Seok et al. |
| 2022/0119360 | A1 | 4/2022 | Mochizuki et al. |
| 2022/0127277 | A1 | 4/2022 | Ham et al. |

FOREIGN PATENT DOCUMENTS

| | | | |
|---|---|---|---|
| KR | 10-2059550 | B1 | 12/2019 |
| KR | 2021-0052311 | A | 5/2021 |
| KR | 2021-0128363 | A | 10/2021 |
| KR | 2021-0128942 | A | 10/2021 |
| TW | 202041503 | A | 11/2020 |
| WO | 2022/025647 | A1 | 2/2022 |
| WO | 2022/025648 | A1 | 2/2022 |
| WO | 2022/055321 | A1 | 3/2022 |

* cited by examiner (1－1)

(1－2)

(1－3)

(1－4)

(1－5)

(1－6)

(1－7)

(1－8)

(1－9)

(1－10)

(1－11)

(1－12)

(1－13)

(1－14)

(1－15)

(1-16)

(1-17)

(1-18)

(1-19)

(1-20)

(1-21)

(1-22)

(1-23)

(1-24)

(1-25)

(1-26)

(1-27)

(1-28)

(1-29)

(1-30)

(1-31)

(1-32)

(1-33)

(1-34)

(1-35)

(1-36)

(1-37)

(1-38)

(1-39)

(1-40)

(1-41)

(1-42)

(1-43)

(1-44)

(1-45)

(1-46)

(1-47)

(1-48)

(1-49)

(1-50)

(1-51)

(1-52)

(1-53)

(1-54)

(1-55)

(1-56)

(1-57)

(1-58)

(1-59)

(1-60)

(1-61)

(1-62)

(1-63)

(1-64)

(1-65)

(1-66)

(1-67)

(1-68)

(1-69)

(1-70)

(1-71)

(1-72)

(1-73)

(1-74)

(1-75)

(1-76)

(1-77)

(1-78)

(1-79)

(1-80)

(1-81)

(1-82)

(1-83)

(1-84)

(1-85)

(1-86)

(1-87)

(1-88)

(1-89)

(1-90)

(1-91)

(1-92)

(1-93)

(1-94)

(1-95)

(1-96)

(1-97)

(1-98)

(1-99)

(1-100)

(1-101)

(1-102)

(1-103)

(1-104)

(1-105)

(1－106)

(1－107)

(1－108)

(1－109)

(1－110)

(1－111)

(1－112)

(1－113)

(1－114)

(1－115)

(1－116)

(1－117)

(1－118)

(1－119)

(1－120)

(1－121)

(1－122)

(1－123)

(1－124)

(1－125)

(1－126)

(1－127)

(1－128)

(1－129)

(1－130)

(1－131)

(1－132)

(1－133)

(1－134)

(1－135)

(1-136)

(1-137)

(1-138)

(1-139)

(1-140)

(1-141)

(1-142)

(1-143)

(1-144)

(1-145)

(1-146)

(1-147)

(1-148)

(1-149)

(1-150)

(1－151)

(1－152)

(1－153)

(1－154)

(1－155)

(1－156)

(1－157)

(1－158)

(1－159)

(1－160)

(1－161)

(1－162)

(1－163)

(1－164)

(1－165)

(1-166)

(1-167)

(1-168)

(1-169)

(1-170)

(1-171)

(1-172)

(1-173)

(1-174)

(1-175)

(1-176)

(1-177)

(1-178)

(1-179)

(1-180)

(1－181)

(1－182)

(1－183)

(1－184)

(1－185)

(1－186)

(1－187)

(1－188)

(1－189)

(1－190)

(1－191)

(1－192)

(1－193)

(1－194)

(1－195)

(1-196)

(1-197)

(1-198)

(1-199)

(1-200)

(1-201)

(1-202)

(1-203)

(1-204)

(1-205)

(1-206)

(1-207)

(1-208)

(1-209)

(1-210)

(1-211)

(1-212)

(1-213)

(1-214)

(1-215)

(1-216)

(1-217)

(1-218)

(1-219)

(1-220)

(1-221)

(1-222)

(1-223)

(1-224)

(1-225)

ORGANIC ELECTROLUMINESCENT DEVICE, AND ELECTRONIC APPARATUS

TECHNICAL FIELD

The present invention relates to compounds and devices suitable for a preferred self-luminous electron device for various display devices, particularly an organic electroluminescent device (hereinafter referred to as organic EL device), which is and more specifically relates to an amine compound having a benzofuran structure or a benzothiophene structure and an organic EL device using the amine compound or an electronic apparatus.

BACKGROUND ART

In 1987, C. W. Tang and colleagues at Eastman Kodak developed a laminated structure device using materials assigned with different roles, realizing practical applications of an organic EL device with organic materials. These researchers laminated an electron-transporting phosphor and a hole-transporting organic substance and injected both charges into a phosphor layer to cause emission to obtain a high luminance of 1,000 cd/m 2 or more at a voltage of 10 V or less (see PTLs 1 and 2).

To date, many improvements have been made for the practical application of organic EL devices. Various roles of the laminated structure have been further subdivided to provide a light emitting device that includes an anode, a hole injection layer, a hole transport layer, a light emitting layer, an electron transport layer, an electron injection layer, and a cathode sequentially on a substrate. In this light emitting device, high efficiency and durability have come to be achieved by providing thereto a bottom emission structure that emits light from the bottom (see, for example, NPL 1).

Recently, a light emitting device with a top emission structure in which a metal having a high work function is used for an anode and light is emitted from the top is coming into use. In a light emitting device with a bottom-emission structure where light is taken out from the bottom having a pixel circuit, the area of the light emitting portion is limited, whereas in a light emitting device with a top-emission structure has the advantage that the light is taken out from the top and is not blocked by the pixel circuit, thus allowing a larger emission area. In the light emitting device with a top emission structure, translucent electrodes made of LiF/Al/Ag (see, for example, NPL 2), Ca/Mg (see, for example, NPL 3), LiF/MgAg, or the like are used for a cathode.

In such light emitting device, when light emitted by a light emitting layer enters another layer at a certain angle or more, the light is totally reflected at an interface between the light emitting layer and the other layer. Thus, light that can be used has been limited to only a part of the emitted light. Recently, a light emitting device has been proposed in which a “capping layer” with a high refractive index is provided on the outside of a translucent electrode with a low refractive index, in order to improve the light extraction efficiency (see, for example, NPLs 2 and 3).

Regarding the effect of the capping layer in a light emitting device with a top emission structure, while a light emitting device using $Ir(ppy)_3$ as a light emitting material has a current efficiency of 38 cd/A in the case of not having a capping layer, the light emitting device has a current efficiency of 64 cd/A, in the case of using a ZnSe film with a thickness of 60 nm as a capping layer, which indicates that the efficiency is improved about 1.7 times. Furthermore, it is indicated that the maximum point of transmittance of the translucent electrode and capping layer does not necessarily coincide with the maximum point of efficiency, and that the maximum point of light extraction efficiency is determined by interference effects (see, for example, NPL 3).

In the past, it has been proposed to use a metal mask with a high degree of definition to form the capping layer, but there is a problem that the metal mask is distorted by heat when used under high temperature conditions, resulting in a decrease in alignment accuracy. Therefore, ZnSe has a high melting point of 1100° C. or higher (see, for example, NPL 3), and a high definition metal mask cannot be used to deposit ZnSe at precise positions, which may affect the light emitting devices themselves. Furthermore, even deposition by the sputtering method affects the light emitting devices, inorganic materials are not suitable for use as components of the capping layer.

In addition, when tris(8-hydroxyquinoline)aluminum (hereinafter referred to as $Alq_3$) is used as a capping layer to adjust the refractive index (see, for example, NPL 2), $Alq_3$ is known as an organic EL material commonly used as a green emitting material or electron transport material, it has a weak absorption around 450 nm, which is used for blue emitting materials, and has the problems of reducing the color purity and light extraction efficiency of blue emitting devices.

Amine compounds introduced benzothiophene which is used for an organic EL device are disclosed, and these compounds are mainly used as hole transport layers (see, for example, NPLs 3 to 5).

In order to improve the organic EL device characteristics of an organic EL device, and to significantly improve the light extraction efficiency, materials with high refractive index and low extinction coefficient, and excellent thin film stability and durability are required as capping layer materials.

CITATION LIST

Patent Literatures

PTL 1: JPH08-048656A
PTL 2: JP3194657B
PTL 3: JP4604312B
PTL 4: JP5475450B
PTL 5: WO 2014/104500
PTL 6: WO 2013/038627

Non-Patent Literatures

NPL 1: Proceedings of the 9th Meeting of the Japan Society of Applied Physics, pp. 55 to 61 (2001)
NPL 2: Appl. Phys. Let., 78,544(2001)
NPL 3: Appl. Phys. Let., 82,466(2003)

SUMMARY OF THE INVENTION

Technical Problem

An object of the present invention is to improve the device characteristics of an organic EL device and to greatly improve light extraction efficiency. To this end, it is to provide an organic EL device having a capping layer containing a material having (1) high refractive index, (2) good thin film stability, (3) excellent durability, (4) excellent light resistance, and (5) no absorption in the blue, green, and red wavelength regions, respectively.

Physical properties of the material of the capping layer suitable for the present invention include (1) high refractive index, (2) vapor-deposit ability, (3) good thin film stability, and (4) high glass transition point. In addition, physical properties of the device suitable for the present invention include that (1) the light extraction efficiency is high, (2) the color purity does not decrease, (3) it transmits light without change over time, and (4) the lifetime is long.

Solution to Problem

For achieving the object, the present inventors focused on the fact that arylamine based material have excellent thin film stability and durability, and planned amine compounds having specific benzofuran structures or benzothiophene structures with a high refractive index, and fabricated organic EL devices using the compounds as the materials constituting the capping layer, and thoroughly evaluated the properties of the devices, as a result of which the present invention was accomplished.

Specifically, according to the present invention, the following organic EL devices are provided.

1) An organic EL device in this order including at least an anode electrode, a hole transport layer, a light emitting layer, an electron transport layer, a cathode electrode, and a capping layer, and the organic EL device containing an amine compound as a material of the capping layer represented by the following general formula (1).

[Chemical Formula 1]

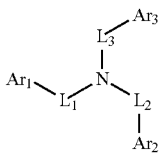

(1)

In the formula, $Ar_1$ and $Ar_2$ may be the same or different, each has a structure represented by the following general formula (A), and represents a monovalent group having a bonding site at any one of $R_5$ and $R_6$. $Ar_3$ has a structure represented by the following general formula (A), and represents a monovalent group having a bonding site at any one of $R_5$ and $R_6$, a substituted or unsubstituted aromatic hydrocarbon group, or a substituted or unsubstituted aromatic heterocyclic group. $L_1$ and $L_2$ may be the same or different, each represents a divalent group of a substituted or unsubstituted aromatic hydrocarbon group of 6 to 18 ring-forming carbon atoms, or a divalent group of a substituted or unsubstituted aromatic heterocyclic group of 6 to 18 ring-forming carbon atoms. $L_3$ represents a divalent group of a substituted or unsubstituted aromatic hydrocarbon group of 6 to 18 ring-forming carbon atoms, a divalent group of a substituted or unsubstituted aromatic heterocyclic group of 6 to 18 ring-forming carbon atoms, or a single bond.

[Chemical Formula 2]

(A)

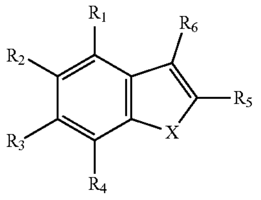

In the formula, X represents an oxygen atom, or a sulfur atom. $R_1$ to $R_4$ may be the same or different, each represents a hydrogen atom, a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to carbon atoms that may have a substituent, a substituted or unsubstituted aromatic hydrocarbon group, a substituted or unsubstituted aromatic heterocyclic group, or a substituted or unsubstituted aryloxy group. $R_1$ to $R_4$ bonded to the same benzene ring may bind to each other via a single bond, a substituted or unsubstituted methylene group, an oxygen atom, or a sulfur atom to form a ring. One of $R_5$ and $R_6$ represents a linking group as a bonding site, a hydrogen atom, a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, or a substituted or unsubstituted aromatic heterocyclic group.

2) The organic EL device according to the item 1), wherein the general formula (A) has a structure represented by the following general formula (A-1).

[Chemical Formula 3]

(A-1)

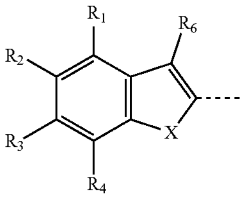

In the formula, the dashed part is the binding site, X, $R_1$ to $R_4$, and $R_6$ are the same as defined by the general formula (A).

3) The organic EL device according to the item 1), wherein the general formula (A) has a structure represented by the following general formula (A-2).

[Chemical Formula 4]

(A-2)

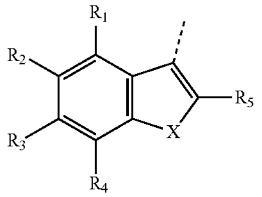

In the formula, the dashed part is the binding site, X, and $R_1$ to $R_5$ are the same as defined by the general formula (A).

4) The organic EL device according to the item 1), wherein $L_1$ and $L_2$ in the general formula (1) are divalent groups that result from the removal of two hydrogen atoms from unsubstituted benzene, divalent groups that result from the removal of two hydrogen atoms from unsubstituted naphthalene, or divalent groups that result from the removal of two hydrogen atoms from unsubstituted biphenyl.

5) The organic EL device according to the item 1), wherein the amine compound represented by the general formula (1) is represented by the following general formula (1-a).

[Chemical Formula 5]

(1-a)

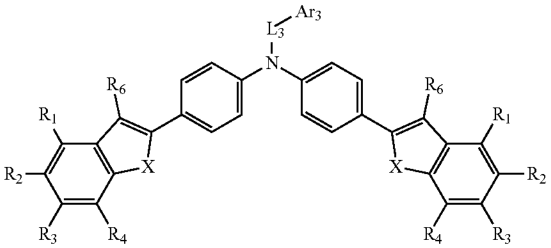

In the formula, X, $Ar_3$, $L_3$, $R_1$ to $R_4$, and $R_6$ are the same as defined by the general formula (1) and the general formula (A).

6) The organic EL device according to the item 1), wherein the amine compound represented by the general formula (1) is represented by the following general formula (1-b).

[Chemical Formula 6]

(1-b)

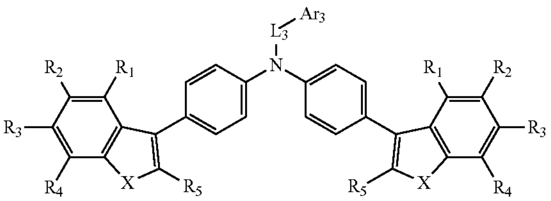

In the formula, X, $Ar_3$, $L_3$, and $R_1$ to $R_5$ are the same as defined by the general formula (1) and the general formula (A).

7) The organic EL device according to any one of the items 1) to 6), wherein the thickness of the capping layer is within a range of 30 nm to 120 nm.

8) The organic EL device according to any one of the items 1) to 7), wherein the refractive index of the capping layer is 1.85 or more within a wavelength range of 450 nm or more and 750 nm or less.

9) An electronic apparatus comprising the organic EL device according to any one of the items 1) to 8).

In the present invention, the "unsubstituted" in the case of the "substituted or unsubstituted" means that a hydrogen atom is not substituted with a substituent.

In the present invention, specific examples of the "substituent" in the "substituted or unsubstituted" include a cyano group, a nitro group, a halogen atom; a linear or branched alkyl group of 1 to 6 carbon atoms, such as a methyl group, an ethyl group, an n-propyl group, an isopropyl group, an n-butyl group, an isobutyl group, a tert-butyl group, an n-pentyl group, an isopentyl group, a neopentyl group, and an n-hexyl group; a cycloalkyl group of 5 to 10 carbon atoms, such as a cyclopentyl group, a cyclohexyl group, a cycloheptyl group, a cyclooctyl group, a cyclononyl group, a cyclodecyl group, and an adamantyl group; a linear or branched alkenyl group of 2 to 6 carbon atoms, such as an ethenyl group, a propenyl group, a 2-methylpropenyl group, a 1-butenyl group, a 2-butenyl group, a 3-butenyl group, and a 1,3-butadienyl group; a linear or branched alkyloxy group of 1 to 6 carbon atoms, such as a methyloxy group, an ethyloxy group, an n-propyloxy group, an isopropyloxy group, an n-butyloxy group, an n-pentyloxy group, and an n-hexyloxy group; a cycloalkyloxy group of 5 to 10 carbon atoms, such as a cyclopentyloxy group, and a cyclohexyloxy group; an aromatic hydrocarbon group, such as a phenyl group, a biphenyl group, a terphenyl group, a naphthyl group, an anthracenyl group, a phenanthrenyl group, a fluorenyl group, a spirobifluorenyl group, an indenyl group, a pyrenyl group, a perylenyl group, a fluoranthenyl group, and a triphenylenyl group; an aromatic heterocyclic group, such as a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a quinoxalinyl group, a benzoimidazolyl group, a pyrazolyl group, a dibenzofuranyl group, a dibenzothienyl group, a naphthyridinyl group, a phenanthrolinyl group, an acridinyl group, a carbolinyl group, a benzoxazolyl group, a benzothiazolyl group, and a phenoxazinyl group; an aryloxy group, such as a phenyloxy group, and a naphthyloxy group. These substituents may be further substituted with the exemplified substituents above. These substituents may be bonded to each other to form a ring through a single bond, a substituted or unsubstituted methylene group, an oxygen atom, or a sulfur atom.

In the present invention, a cyano group, a nitro group, a halogen atom, a methyl group, an ethyl group, an n-propyl group, a methyloxy group, an ethyloxy group, an n-propyloxy group, or a phenyl group is preferably used among the exemplified "substituents" above.

Specific examples of the "aromatic hydrocarbon group" in the "divalent group of a substituted or unsubstituted aromatic hydrocarbon group of 6 to 18 ring-forming carbon atoms" represented by $L_1$, $L_2$, $L_3$ in the general formula (1) include benzene, biphenyl, terphenyl, naphthalene, anthracene, phenanthrene, and fluorene. Then, the "divalent group of an aromatic hydrocarbon group" in the "divalent group of a substituted or unsubstituted aromatic hydrocarbon group of 6 to 18 ring-forming carbon atoms" represented by $L_1$, $L_2$, $L_3$ in the general formula (1) is a divalent group obtained by removing two hydrogen atoms from the above "aromatic hydrocarbon".

Here, the above “divalent group of an aromatic hydrocarbon” is preferably a divalent group that results from the removal of two hydrogen atoms from benzene (i.e., a phenylene group), a divalent group that results from the removal of two hydrogen atoms from biphenyl, or a divalent group that results from the removal of two hydrogen atoms from naphthalene.

The divalent group that results from the removal of two hydrogen atoms from benzene (i.e., a phenylene group) is preferably a divalent group that results from the removal of two hydrogen atoms at the 1,4-positions from benzene (i.e., a 1,4-phenylene group), or a divalent group that results from the removal of two hydrogen atoms at the 1,3-positions from benzene (i.e., a 1,3-phenylene group).

The divalent group that results from the removal of two hydrogen atoms from biphenyl is preferably a divalent group that results from the removal of two hydrogen atoms at the 4,4'-positions from biphenyl.

The divalent group that results from the removal of two hydrogen atoms from naphthalene is preferably a divalent group that results from the removal of two hydrogen atoms at the 1,4-positions from naphthalene or a divalent group that results from the removal of two hydrogen atoms at the 2,7-positions from naphthalene.

In the present invention, $L_3$ is also preferably a single bond.

Specific examples of the “aromatic heterocyclic ring” in the “divalent group of a substituted or unsubstituted aromatic heterocyclic ring of 6 to 18 ring-forming carbon atoms” represented by $L_1$, $L_2$, $L_3$ in the general formula (1) include pyridine, pyrimidine, quinoline, benzofuran, benzothiophene, benzoxazole, benzothiazole, dibenzofuran, dibenzothiophene, and phenanthroline. Then, the “divalent group of an aromatic heterocyclic ring” in the “divalent group of a substituted or unsubstituted aromatic heterocyclic ring of 6 to 18 ring-forming carbon atoms” represented by $L_1$, $L_2$, $L_3$ in the general formula (1) is a divalent group obtained by removing two hydrogen atoms from the above “aromatic heterocyclic ring”.

Specific examples of the “aromatic hydrocarbon group” in the “substituted or unsubstituted aromatic hydrocarbon group” represented by $Ar_3$ in the general formula (1) and $R_1$ to $R_6$ in the general formula (A) include a phenyl group, a biphenyl group, a terphenyl group, a naphthyl group, an anthracenyl group, a phenanthrenyl group, a fluorenyl group, a spirobifluorenyl group, an indenyl group, a pyrenyl group, a perylenyl group, a fluoranthenyl group, and a triphenylenyl group.

Here, the above “aromatic hydrocarbon group” in the “substituted or unsubstituted aromatic hydrocarbon group” represented by $Ar_3$ is preferably a phenyl group, a biphenyl group, a terphenyl group, a naphthyl group, or a phenanthrenyl group.

Specific examples of the “aromatic heterocyclic group” in the “substituted or unsubstituted aromatic heterocyclic group” represented by $Ar_3$ in the general formula (1) and $R_1$ to $R_6$ in the general formula (A) include a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a quinoxalinyl group, a benzoimidazolyl group, a pyrazolyl group, a dibenzofuranyl group, a dibenzothienyl group, a naphthyridinyl group, a phenanthrolinyl group, an acridinyl group, a carbolinyl group, a benzoxazolyl group, a benzothiazolyl group, and a phenoxazinyl group.

Here, the above “aromatic heterocyclic group” in the “substituted or unsubstituted aromatic heterocyclic group” represented by $Ar_3$ is preferably a quinolyl group, an isoquinolyl group, a benzofuranyl group, a benzothienyl group, a dibenzofuranyl group, a dibenzothienyl group, a benzoxazolyl group, or a benzothiazolyl group.

Specific examples of the “alkyl group” in the “linear or branched alkyl group of 1 to 6 carbon atoms that may have a substituent” represented by $R_1$ to $R_6$ in the general formula (A) include a methyl group, an ethyl group, an n-propyl group, an isopropyl group, an n-butyl group, an isobutyl group, a tert-butyl group, an n-pentyl group, an isopentyl group, a neopentyl group, and an n-hexyl group.

Specific examples of the “cycloalkyl group” in the “cycloalkyl group of 5 to 10 carbon atoms that may have a substituent” represented by $R_1$ to $R_6$ in the general formula (A) include a cyclopentyl group, a cyclohexyl group, a cycloheptyl group, a cyclooctyl group, a cyclononyl group, a cyclodecyl group, and an adamantyl group.

Specific examples of the “alkenyl group” in the “linear or branched alkenyl group of 2 to 6 carbon atoms that may have a substituent” represented by $R_1$ to $R_6$ in the general formula (A) include an ethenyl group, a propenyl group, a 2-methylpropenyl group, a 1-butenyl group, a 2-butenyl group, a 3-butenyl group, and a 1,3-butadienyl group.

Specific examples of the “alkyloxy group” in the “linear or branched alkyloxy group of 1 to 6 carbon atoms that may have a substituent” represented by $R_1$ to $R_6$ in the general formula (A) include a methyloxy group, an ethyloxy group, an n-propyloxy group, an isopropyloxy group, an n-butyloxy group, an n-pentyloxy group, and an n-hexyloxy group.

Specific examples of the “cycloalkyloxy group” in the “cycloalkyloxy group of 5 to 10 carbon atoms that may have a substituent” represented by $R_1$ to $R_6$ in the general formula (A) include a cyclopentyloxy group, and a cyclohexyloxy group.

Specific examples of the “aryloxy group” in the “substituted or unsubstituted aryloxy group” represented by $R_1$ to $R_4$ in the general formula (A) include a phenyloxy group, and a naphthyloxy group.

In the organic EL device of the present invention, the thickness of the capping layer is preferably in a range of nm to 120 nm, and more preferably in a range of 40 nm to 80 nm.

In the organic EL device of the present invention, the refractive index of the capping layer to light transmitted through the capping layer is preferably 1.85 or more within a wavelength range of 450 nm or more and 750 nm or less, more preferably 1.88 or more, and further preferably 1.92 or more.

In the organic EL device of the present invention, the capping layer may be produced as a laminated layer or a mixed layer of two or more kinds of different constitutional materials, in this case, the constitutional materials are preferably two or more kinds of different compound selected from the amine compounds represented by the general formula (1) preferably used in the organic EL devices of the present invention.

Advantageous Effects of Invention

The organic EL device of the present invention comprises a capping layer with a higher refractive index than that of the transparent or translucent electrode, which is provided outside the transparent or translucent electrode, making it possible to obtain an organic EL device that can significantly improve the light extraction efficiency.

DESCRIPTION OF EMBODIMENTS

Figure 1:
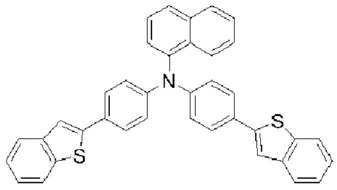
FIG. 1 is a figure showing the structural formulas of the compounds (1-1) to (1-15) as an amine compound represented by the general formula (1) preferably used for FIG. 2 is a figure showing the structural formulas of the compounds (1-16) to (1-30) as an amine compound represented by the general formula (1) preferably used for an organic EL device of the present invention.
Figure 1:
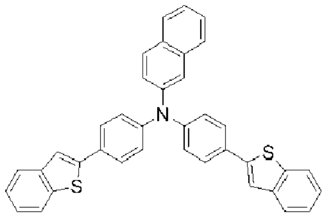
Figure 1:
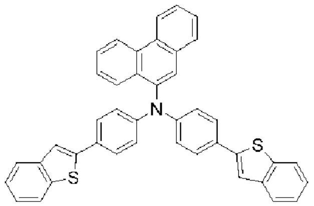
Figure 1:
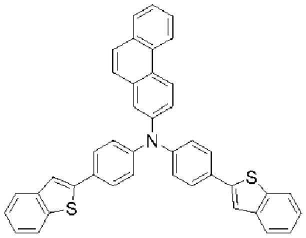
Figure 1:
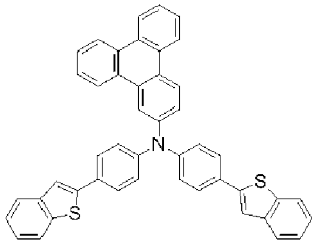
Figure 1:
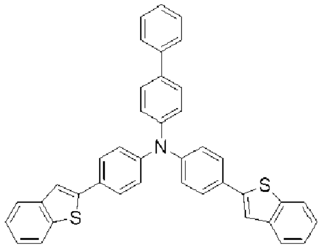
Figure 1:
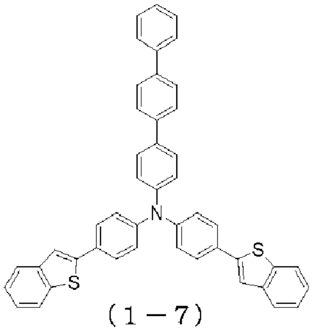
Figure 1:
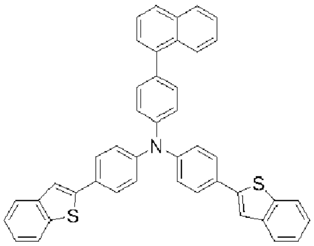
Figure 1:
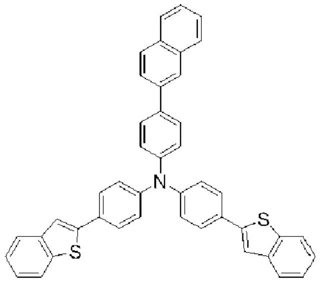
Figure 1:
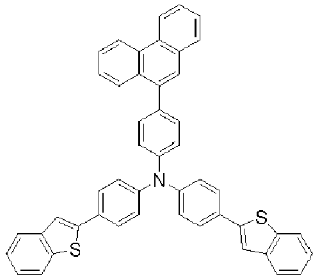
Figure 1:
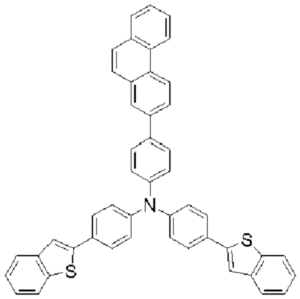
Figure 1:
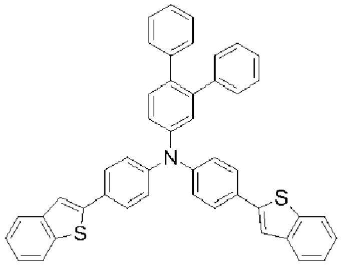
Figure 1:
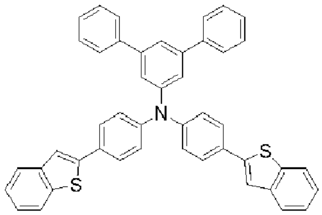
Figure 1:
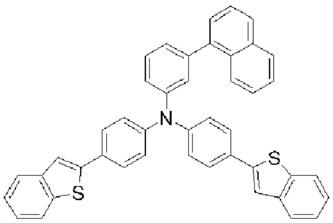
Figure 1:
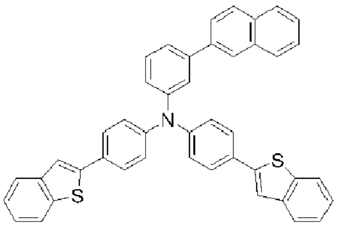
Figure 2:
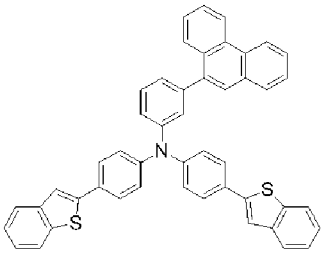
Figure 2:
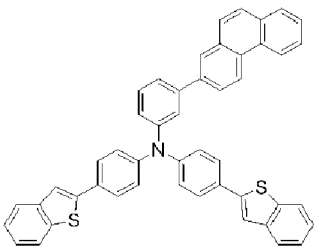
Figure 2:
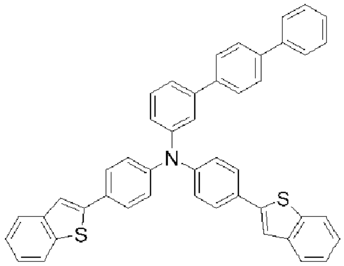
Figure 2:
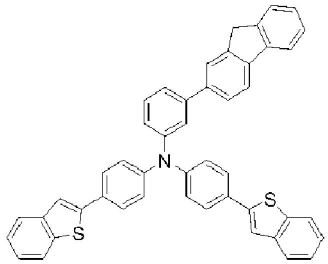
Figure 2:
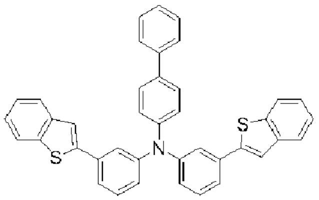
Figure 2:
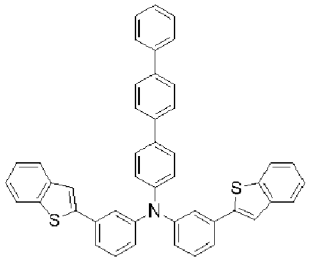
Figure 2:
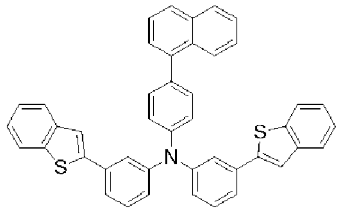
Figure 2:
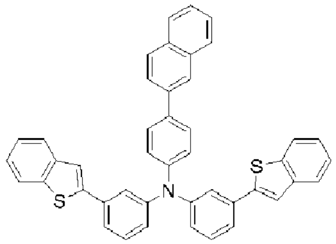
Figure 2:
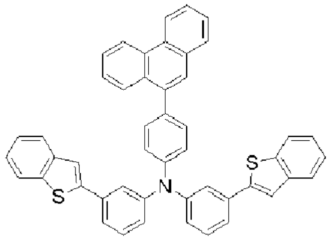
Figure 2:
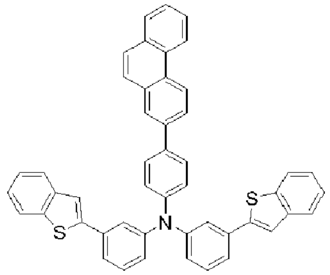
Figure 2:
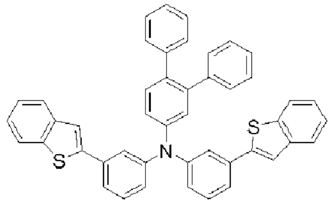
Figure 2:
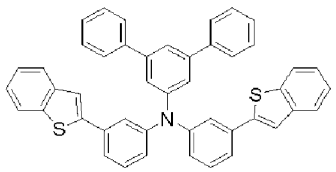
Figure 2:
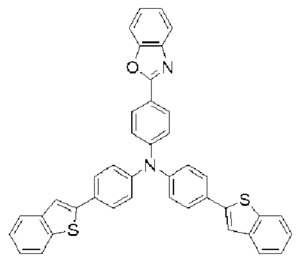
Figure 2:
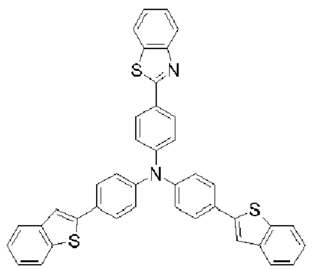
Figure 2:
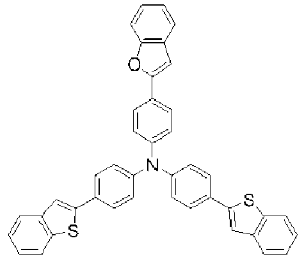
Figure 3:
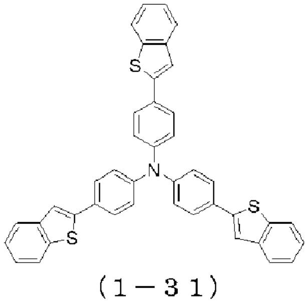
FIG. 3 is a figure showing the structural formulas of the compounds (1-31) to (1-45) as an amine compound represented by the general formula (1) preferably used for an organic EL device of the present invention.
Figure 3:
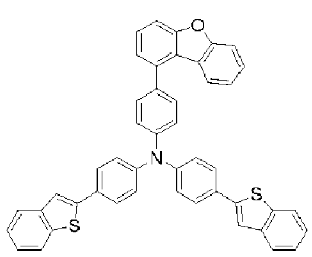
Figure 3:
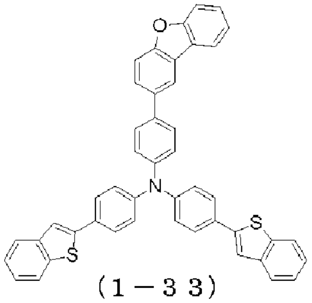
Figure 3:
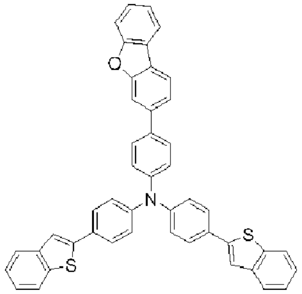
Figure 3:
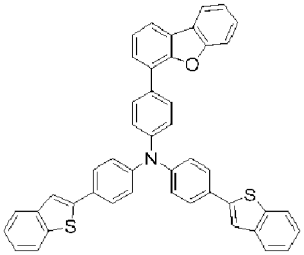
Figure 3:
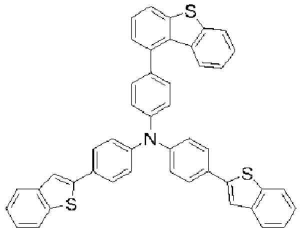
Figure 3:
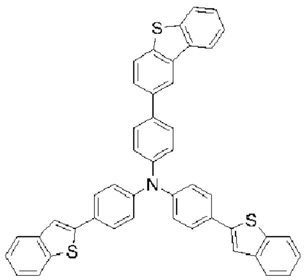
Figure 3:
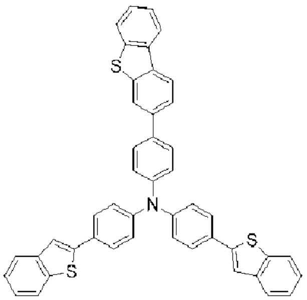
Figure 3:
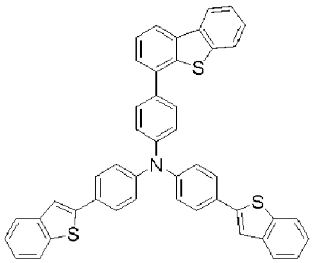
Figure 3:
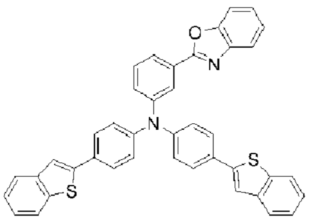
Figure 3:
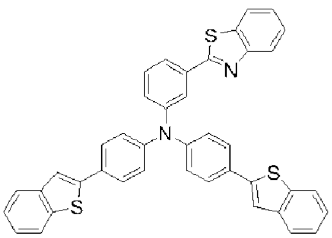
Figure 3:
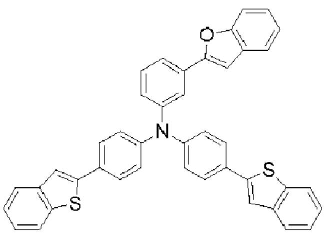
Figure 3:
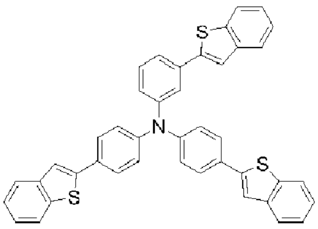
Figure 3:
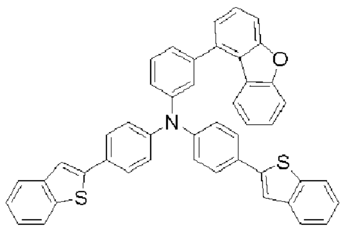
Figure 3:
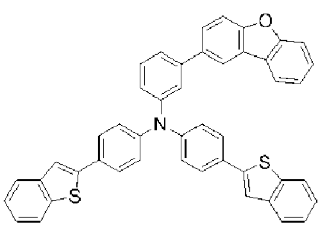
Figure 4:
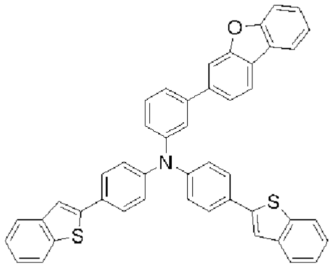
FIG. 4 is a figure showing the structural formulas of the compounds (1-46) to (1-60) as an amine compound represented by the general formula (1) preferably used for an organic EL device of the present invention.
Figure 4:
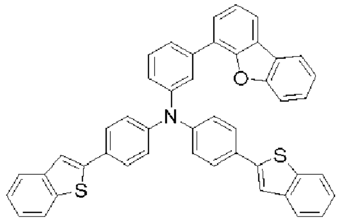
Figure 4:
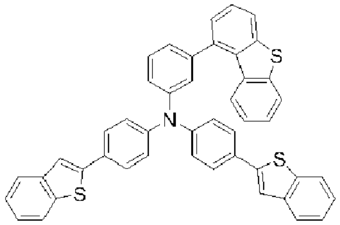
Figure 4:
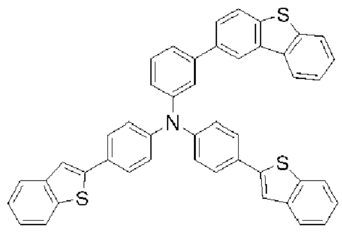
Figure 4:
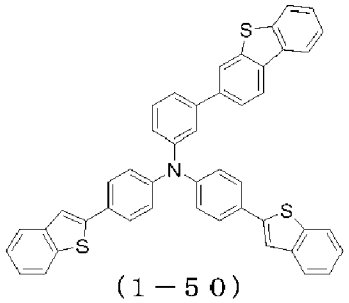
Figure 4:
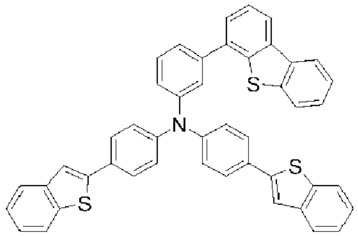
Figure 4:
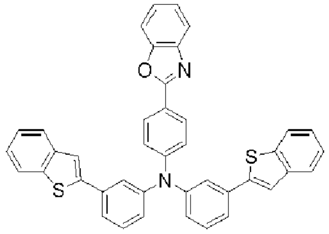
Figure 4:
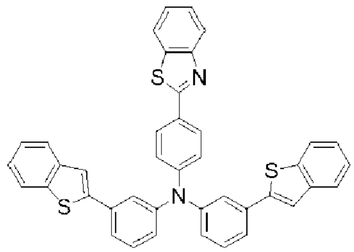
Figure 4:
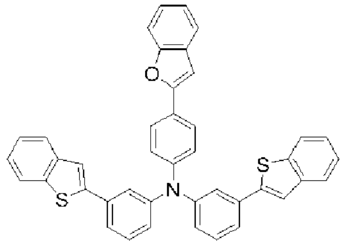
Figure 4:
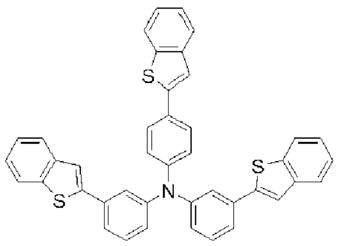
Figure 4:
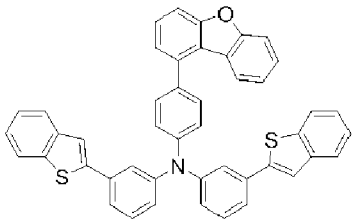
Figure 4:
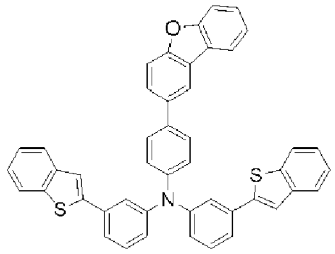
Figure 4:
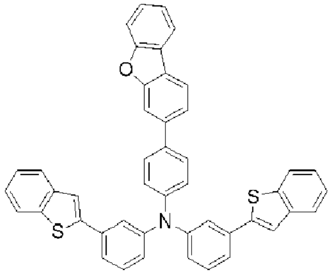
Figure 4:
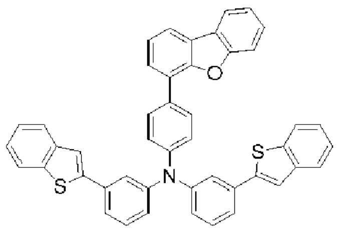
Figure 4:
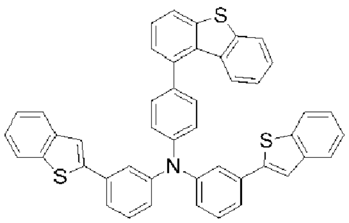
Figure 5:
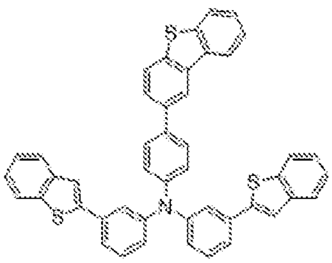
FIG. 5 is a figure showing the structural formulas of the compounds (1-61) to (1-75) as an amine compound represented by the general formula (1) preferably used for an organic EL device of the present invention.
Figure 5:
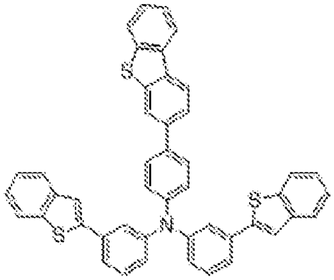
Figure 5:
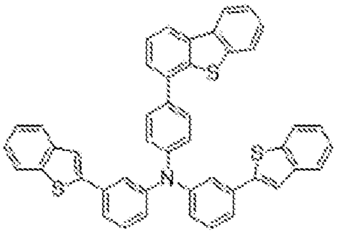
Figure 5:
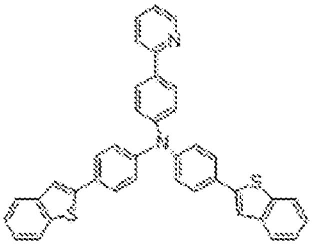
Figure 5:
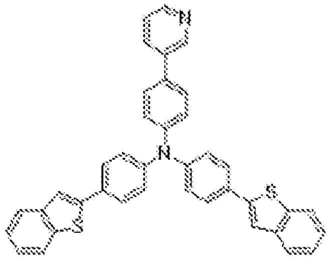
Figure 5:
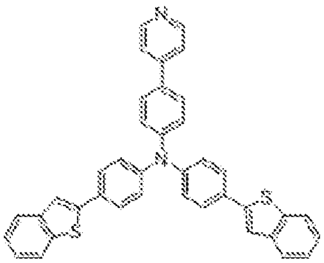
Figure 5:
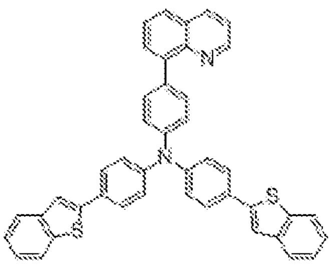
Figure 5:
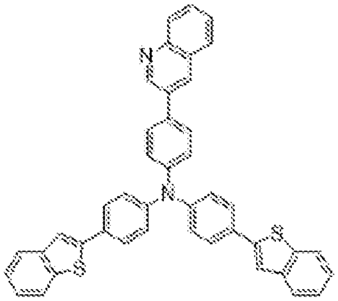
Figure 5:
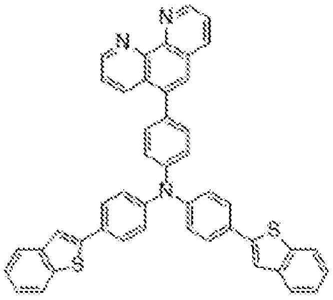
Figure 5:
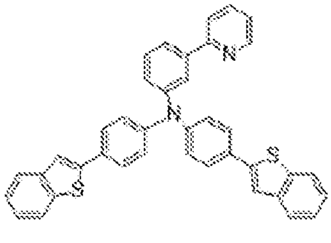
Figure 5:
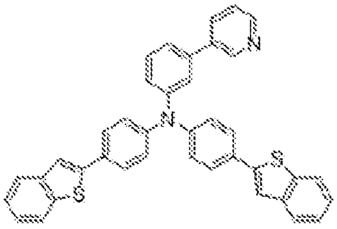
Figure 5:
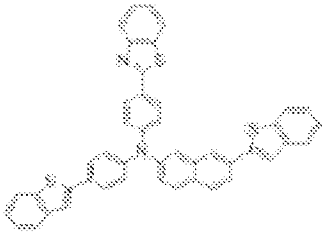
Figure 5:
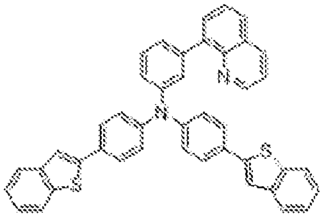
Figure 5:
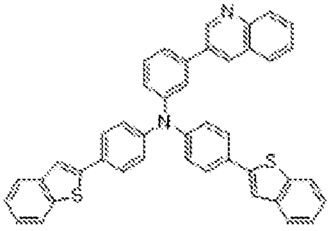
Figure 5:
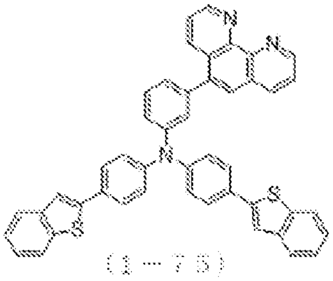
Figure 6:
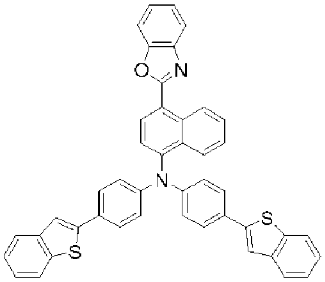
FIG. 6 is a figure showing the structural formulas of the compounds (1-76) to (1-90) as an amine compound represented by the general formula (1) preferably used for an organic EL device of the present invention.
Figure 6:
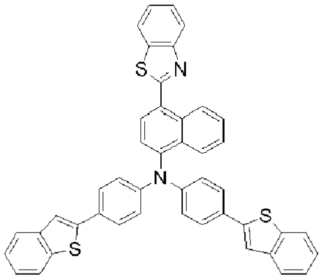
Figure 6:
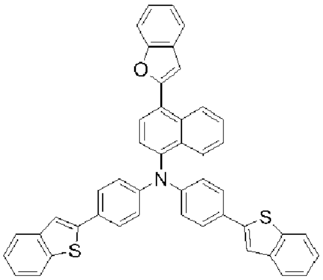
Figure 6:
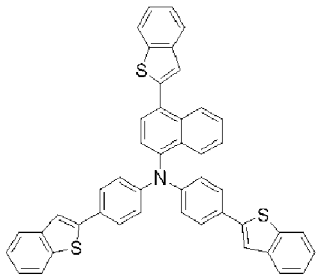
Figure 6:
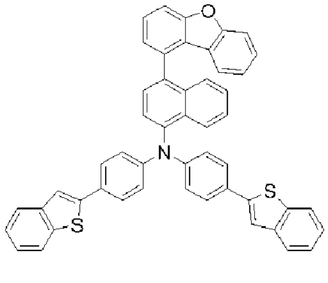
Figure 6:
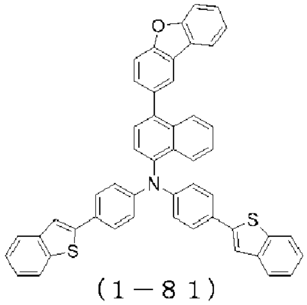
Figure 6:
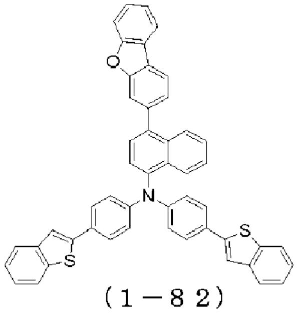
Figure 6:
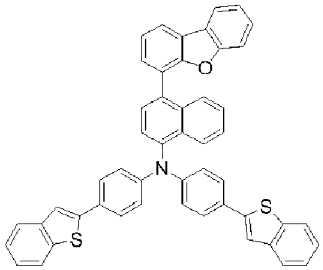
Figure 6:
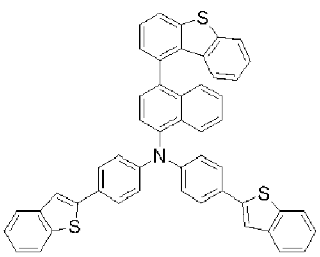
Figure 6:
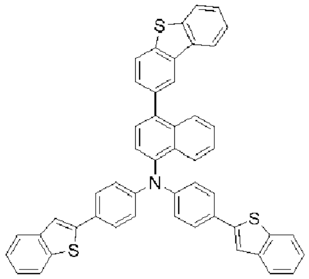
Figure 6:
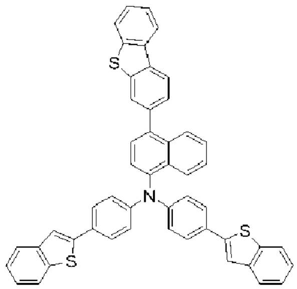
Figure 6:
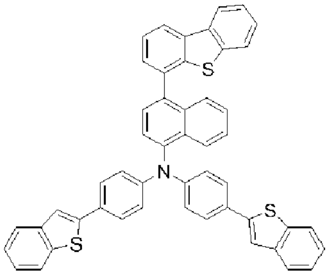
Figure 6:
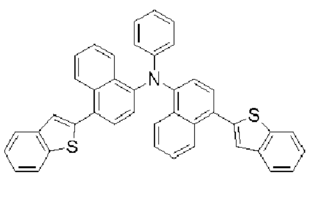
Figure 6:
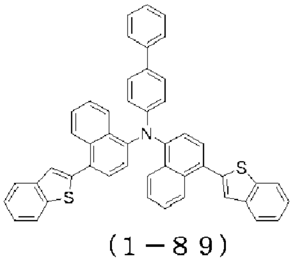
Figure 6:
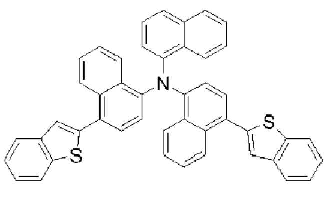
Figure 7:
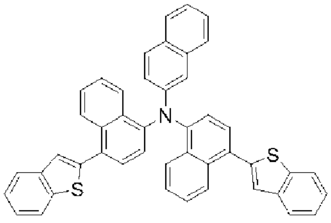
FIG. 7 is a figure showing the structural formulas of the compounds (1-91) to (1-105) as an amine compound represented by the general formula (1) preferably used for FIG. 8 is a figure showing the structural formulas of the compounds (1-106) to (1-120) as an amine compound represented by the general formula (1) preferably used for an organic EL device of the present invention.
Figure 7:
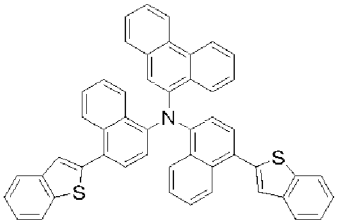
Figure 7:
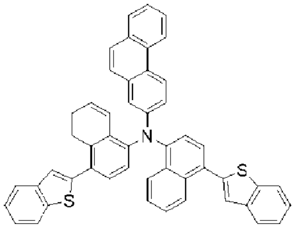
Figure 7:
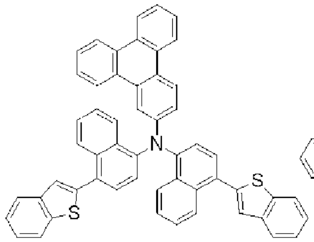
Figure 7:
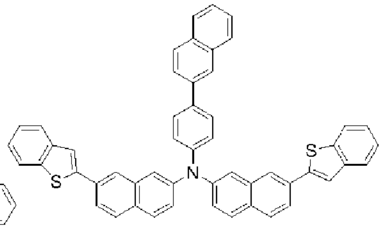
Figure 7:
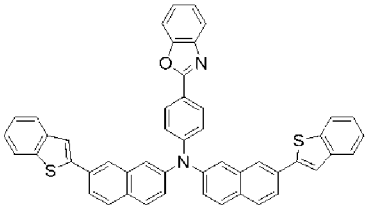
Figure 7:
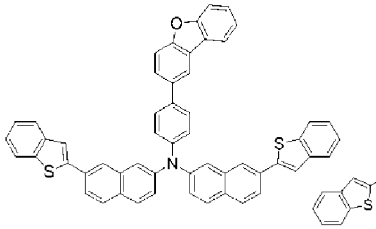
Figure 7:
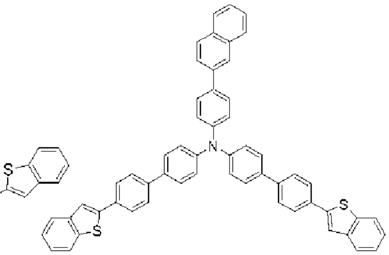
Figure 7:
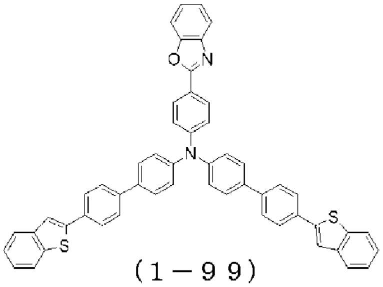
Figure 7:
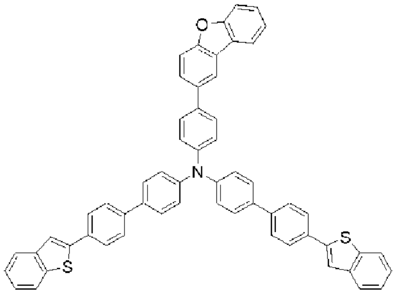
Figure 7:
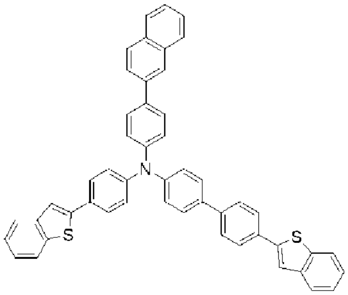
Figure 7:
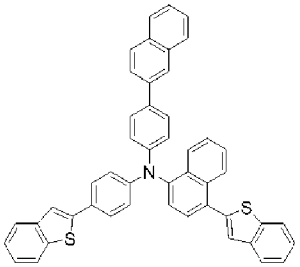
Figure 7:
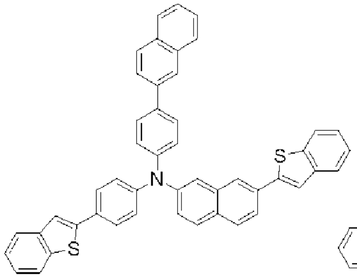
Figure 7:
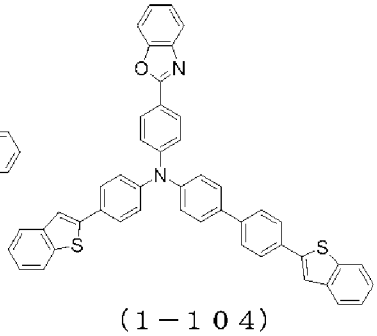
Figure 7:
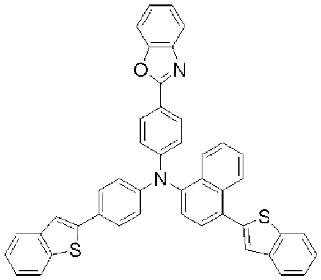
Figure 8:
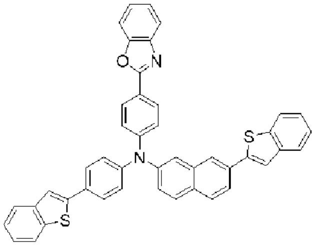
Figure 8:
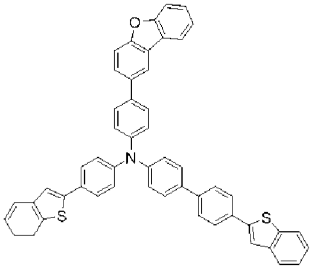
Figure 8:
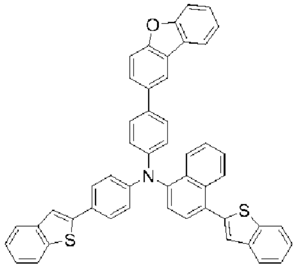
Figure 8:
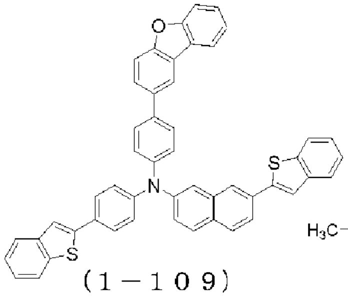
Figure 8:
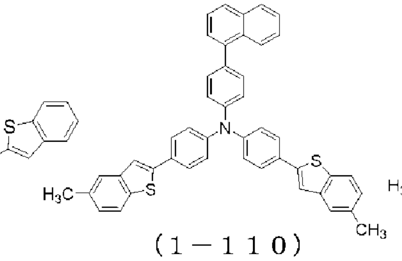
Figure 8:
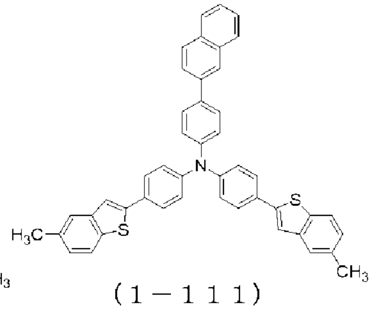
Figure 8:
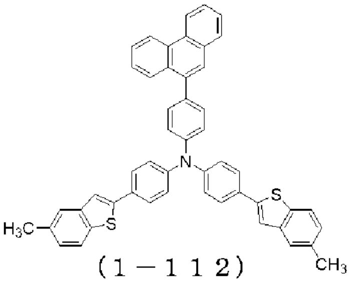
Figure 8:
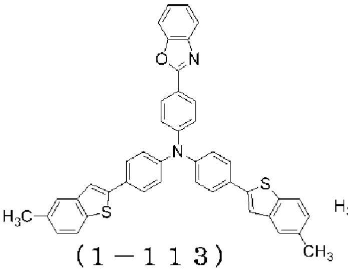
Figure 8:
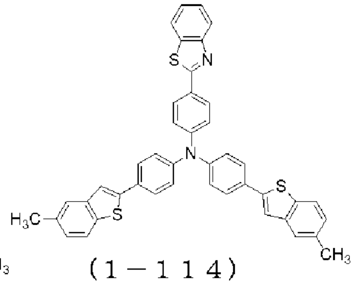
Figure 8:
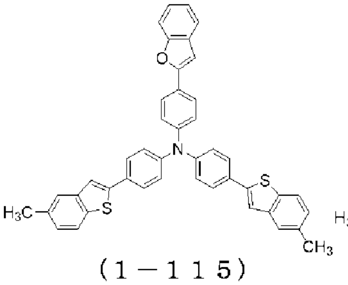
Figure 8:
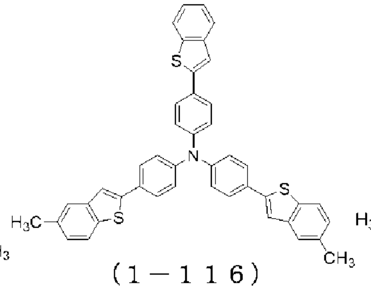
Figure 8:
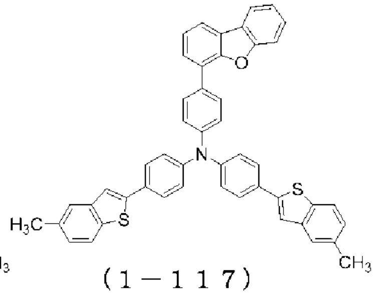
Figure 8:
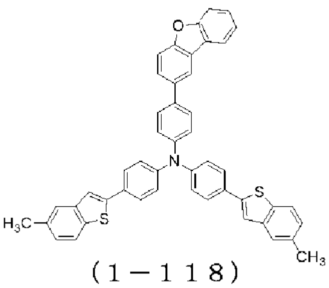
Figure 8:
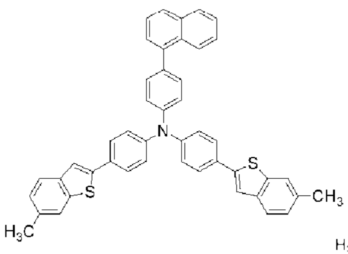
Figure 8:
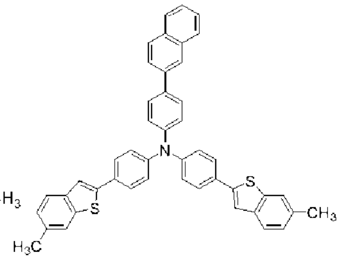
Figure 9:
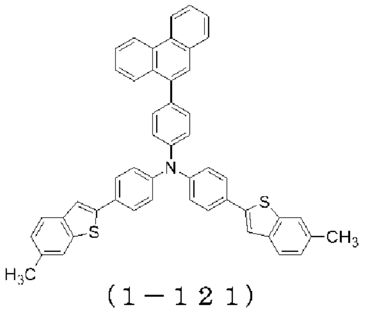
FIG. 9 is a figure showing the structural formulas of the compounds (1-121) to (1-135) as an amine compound represented by the general formula (1) preferably used for an organic EL device of the present invention.
Figure 9:
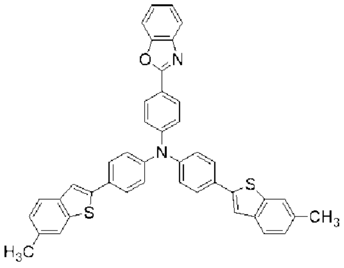
Figure 9:
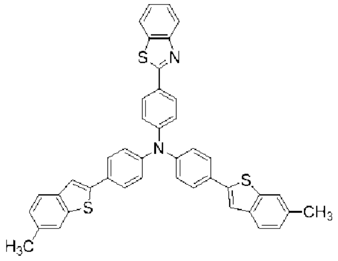
Figure 9:
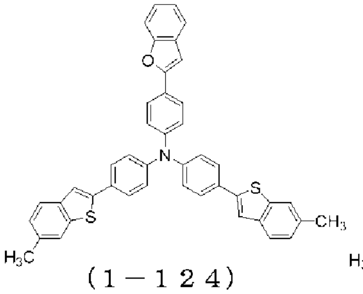
Figure 9:
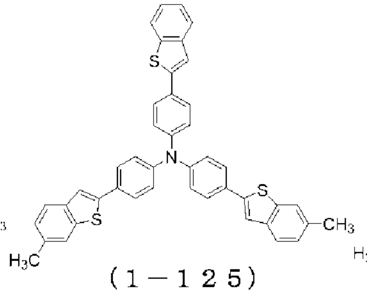
Figure 9:
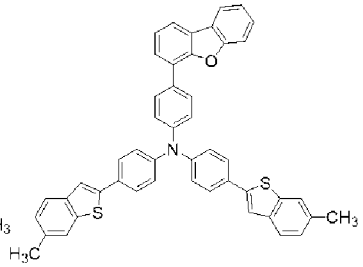
Figure 9:
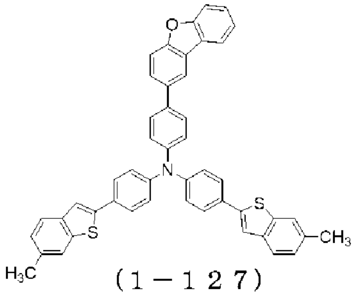
Figure 9:
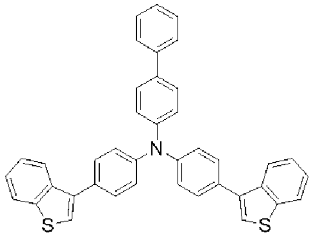
Figure 9:
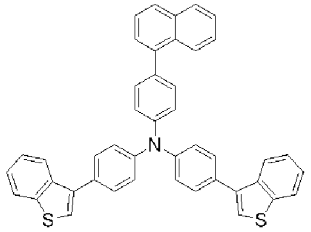
Figure 9:
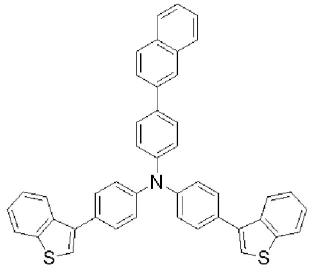
Figure 9:
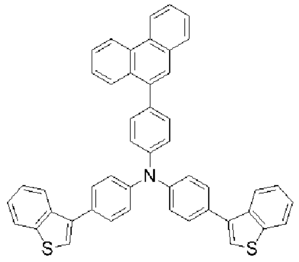
Figure 9:
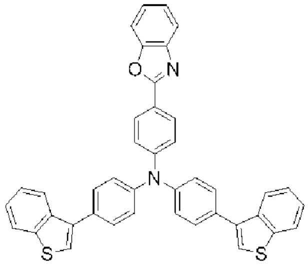
Figure 9:
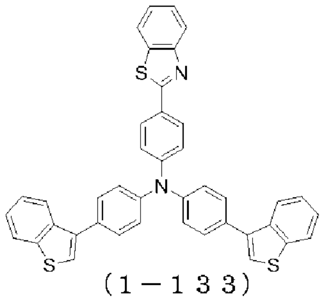
Figure 9:
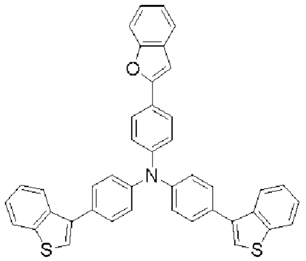
Figure 9:
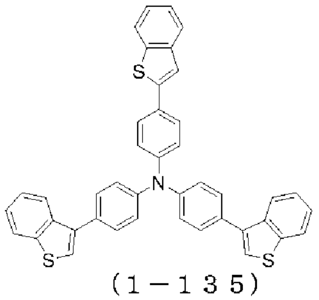
Figure 10:
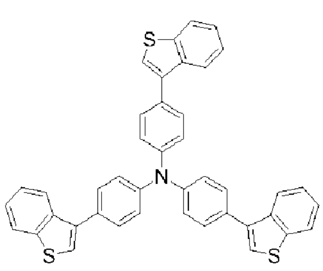
FIG. 10 is a figure showing the structural formulas of the compounds (1-136) to (1-150) as an amine compound represented by the general formula (1) preferably used for an organic EL device of the present invention.
Figure 10:
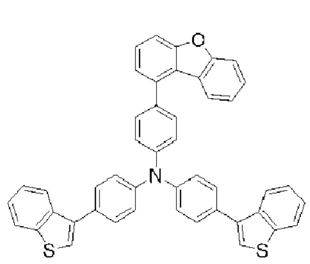
Figure 10:
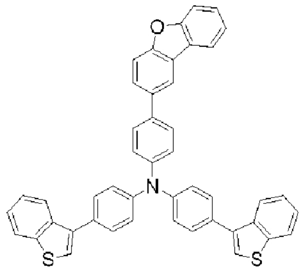
Figure 10:
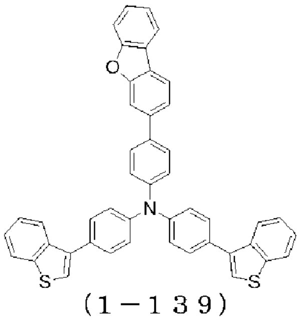
Figure 10:
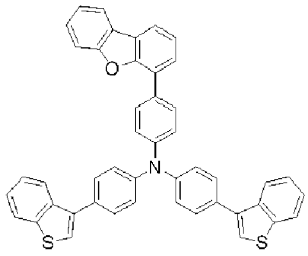
Figure 10:
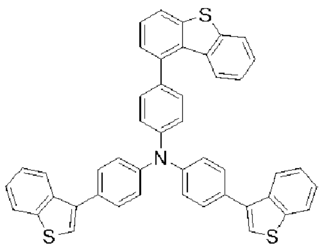
Figure 10:
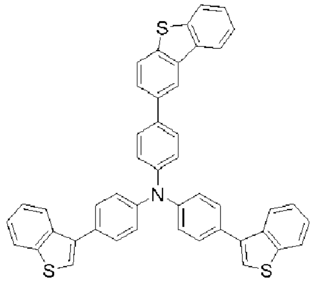
Figure 10:
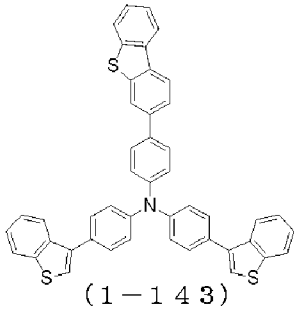
Figure 10:
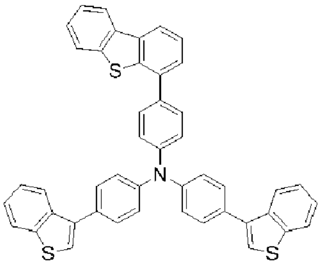
Figure 10:
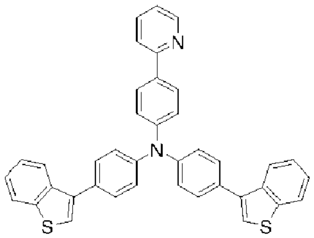
Figure 10:
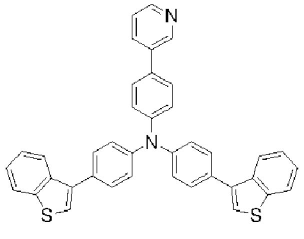
Figure 10:
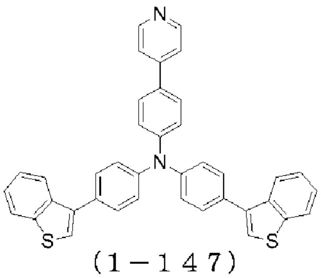
Figure 10:
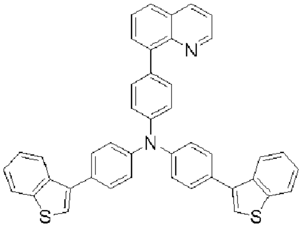
Figure 10:
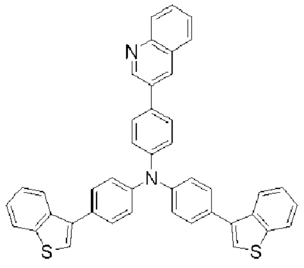
Figure 10:
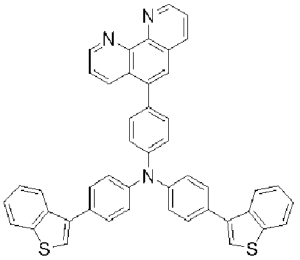
Figure 11:
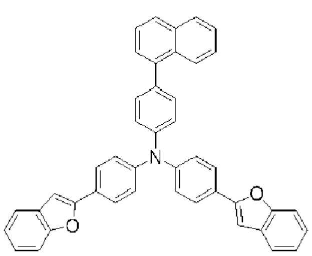
FIG. 11 is a figure showing the structural formulas of the compounds (1-151) to (1-165) as an amine compound represented by the general formula (1) preferably used for an organic EL device of the present invention.
Figure 11:
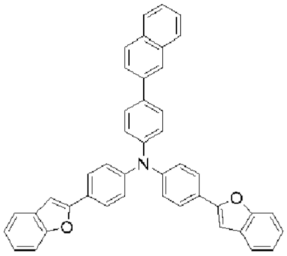
Figure 11:
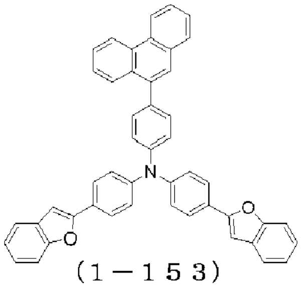
Figure 11:
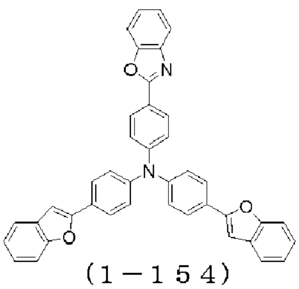
Figure 11:
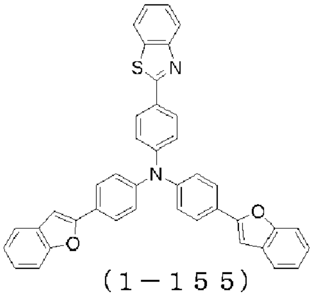
Figure 11:
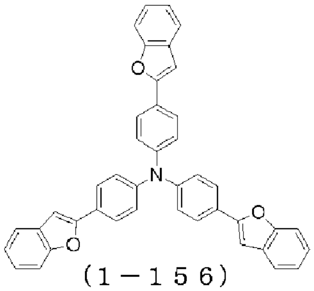
Figure 11:
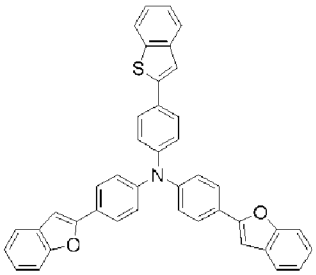
Figure 11:
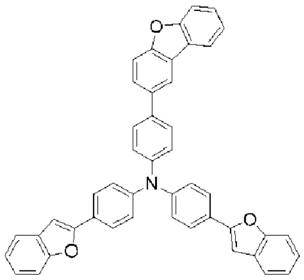
Figure 11:
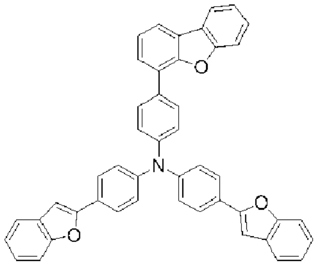
Figure 11:
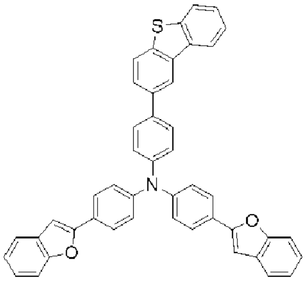
Figure 11:
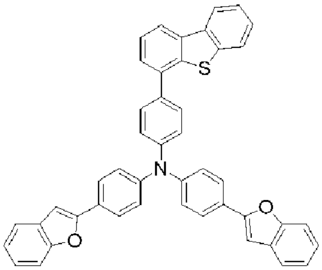
Figure 11:
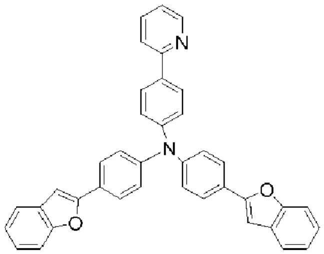
Figure 11:
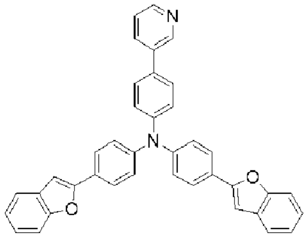
Figure 11:
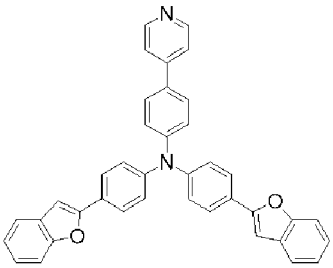
Figure 11:
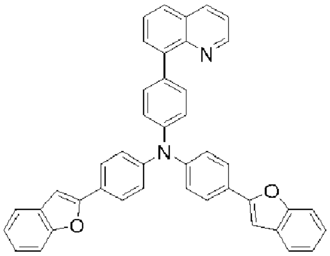
Figure 12:
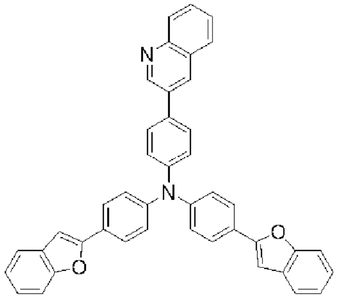
FIG. 12 is a figure showing the structural formulas of the compounds (1-166) to (1-180) as an amine compound represented by the general formula (1) preferably used for an organic EL device of the present invention.
Figure 12:
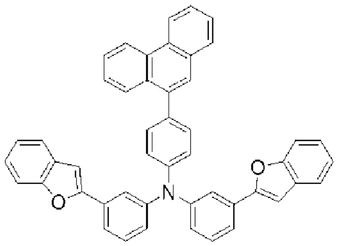
Figure 12:
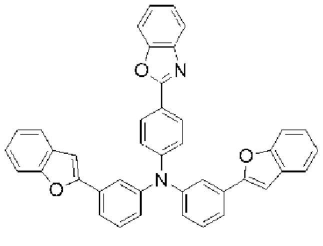
Figure 12:
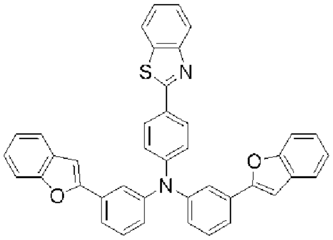
Figure 12:
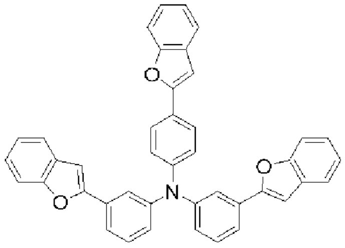
Figure 12:
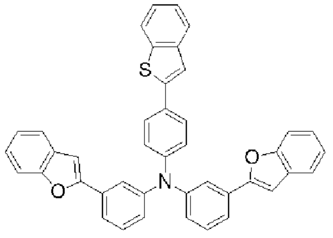
Figure 12:
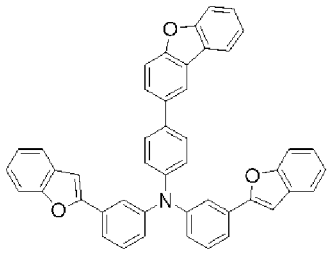
Figure 12:
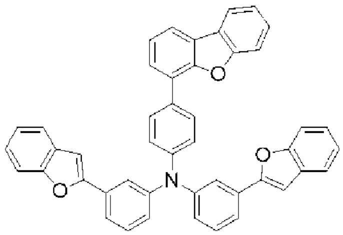
Figure 12:
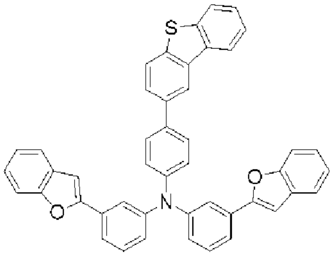
Figure 12:
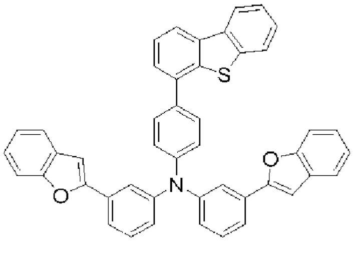
Figure 12:
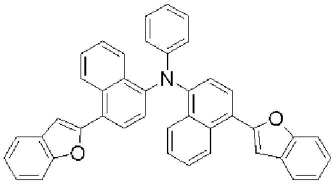
Figure 12:
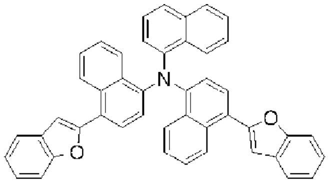
Figure 12:
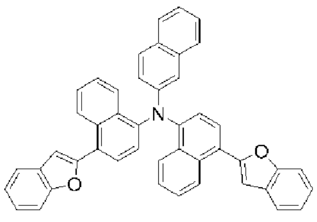
Figure 12:
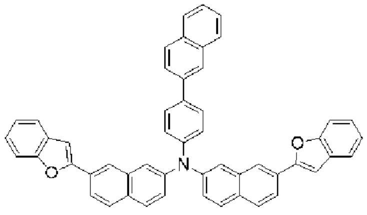
Figure 12:
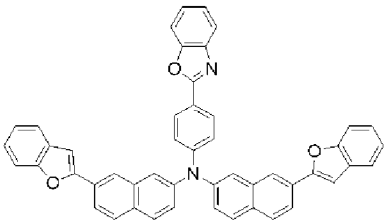
Figure 13:
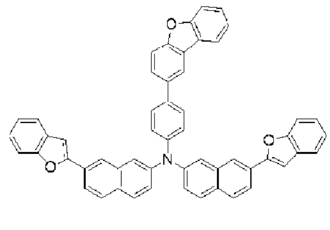
FIG. 13 is a figure showing the structural formulas of the compounds (1-181) to (1-195) as an amine compound represented by the general formula (1) preferably used for FIG. 14 is a figure showing the structural formulas of the compounds (1-196) to (1-210) as an amine compound represented by the general formula (1) preferably used for an organic EL device of the present invention.
Figure 13:
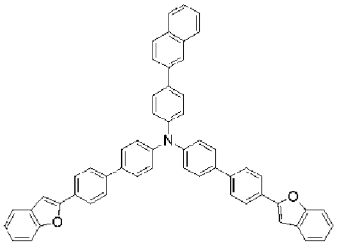
Figure 13:
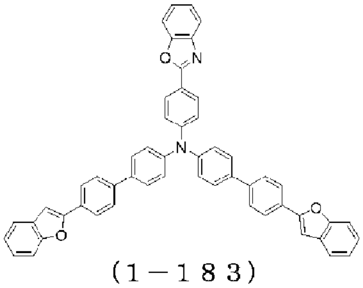
Figure 13:
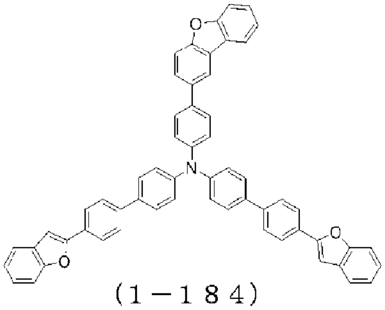
Figure 13:
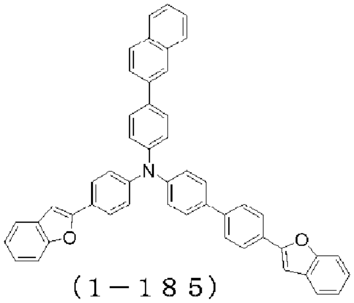
Figure 13:
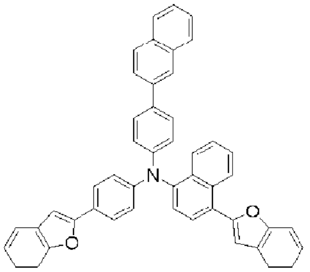
Figure 13:
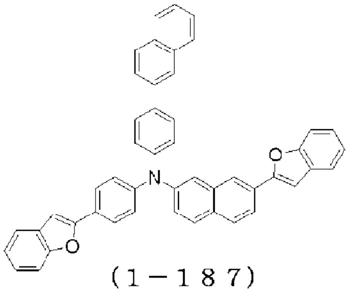
Figure 13:
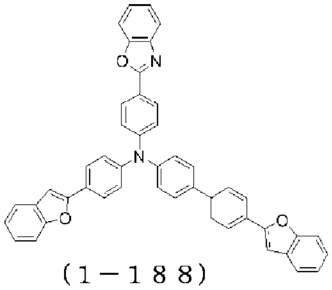
Figure 13:
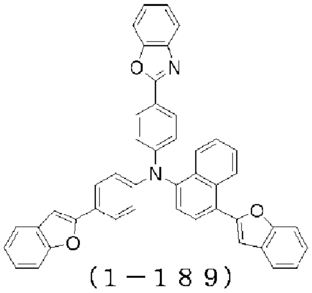
Figure 13:
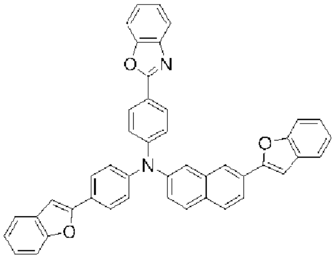
Figure 13:
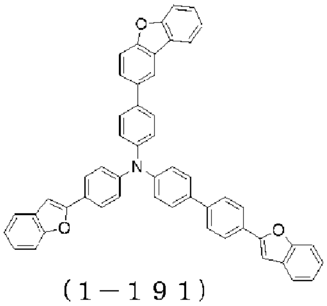
Figure 13:
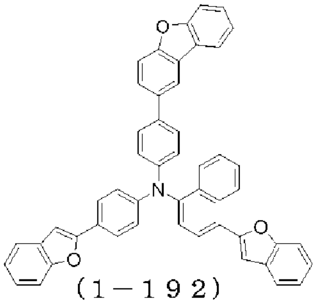
Figure 13:
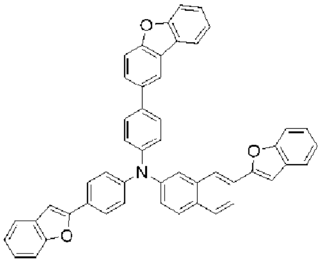
Figure 13:
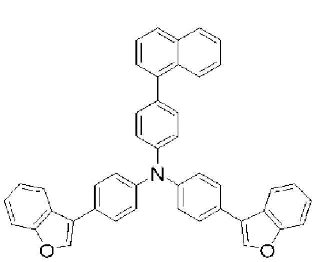
Figure 13:
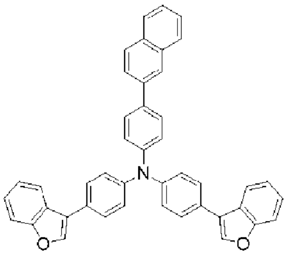
Figure 14:
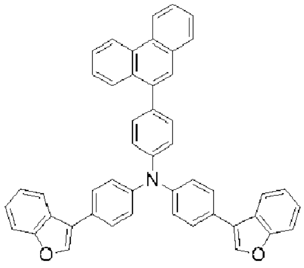
Figure 14:
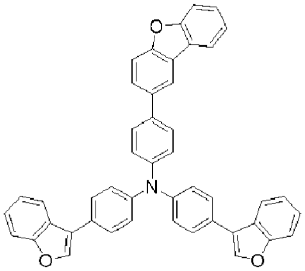
Figure 14:
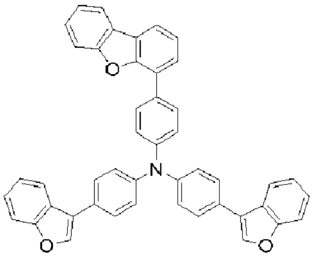
Figure 14:
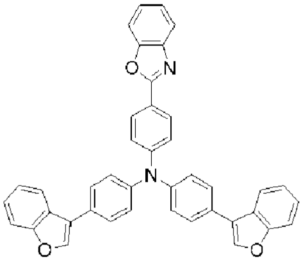
Figure 14:
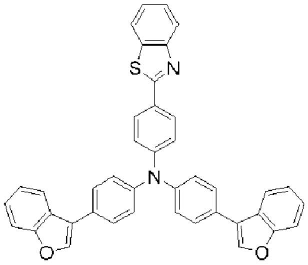
Figure 14:
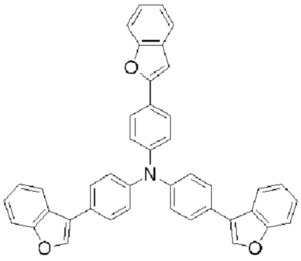
Figure 14:
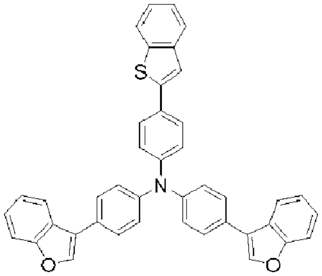
Figure 14:
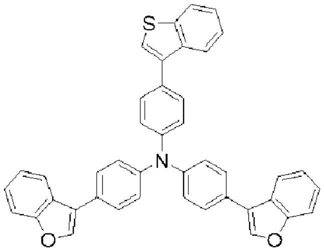
Figure 14:
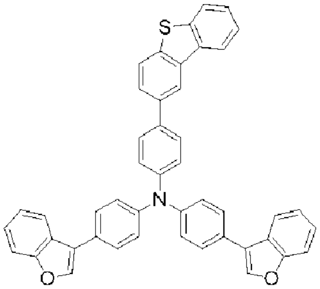
Figure 14:
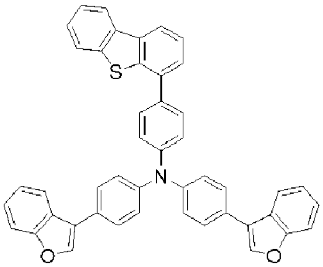
Figure 14:
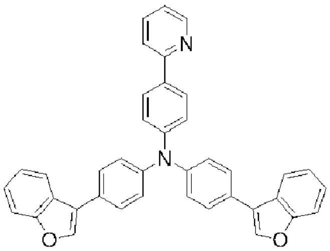
Figure 14:
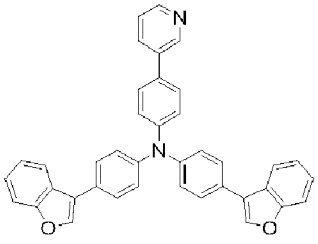
Figure 14:
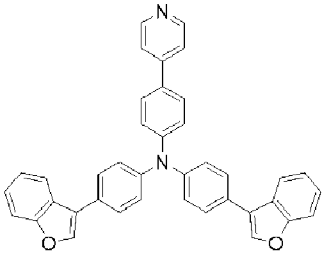
Figure 14:
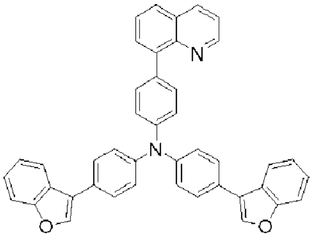
Figure 14:
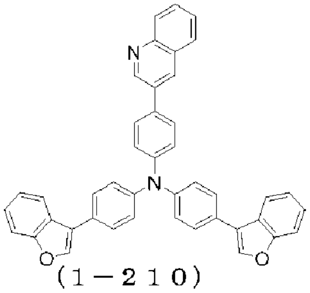
Figure 15:
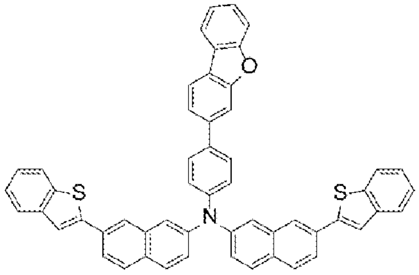
FIG. 15 is a figure showing the structural formulas of the compounds (1-211) to (1-218) as an amine compound represented by the general formula (1) preferably used for an organic EL device of the present invention.
Figure 15:
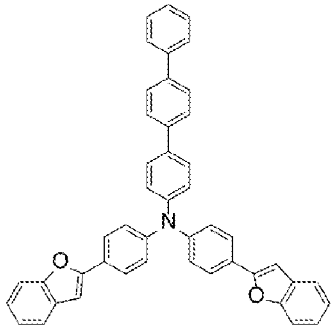
Figure 15:
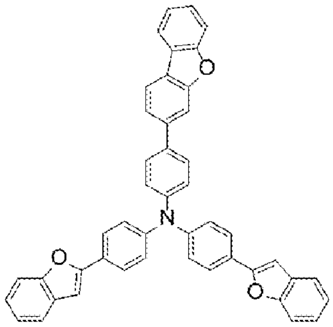
Figure 15:
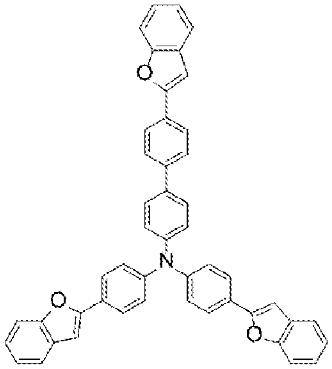
Figure 15:
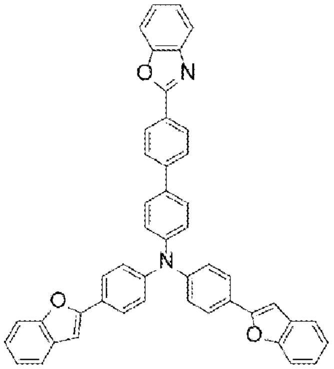
Figure 15:
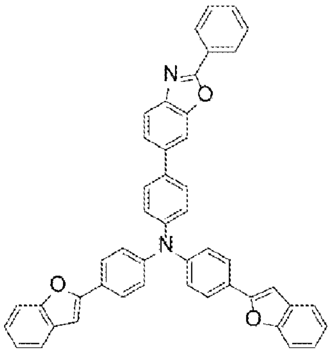
Figure 15:
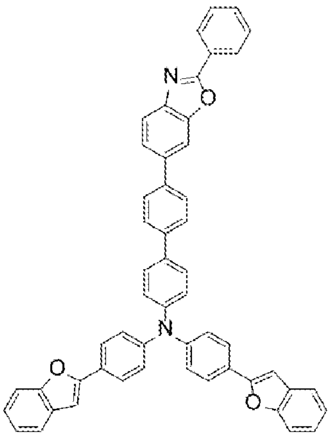
Figure 15:
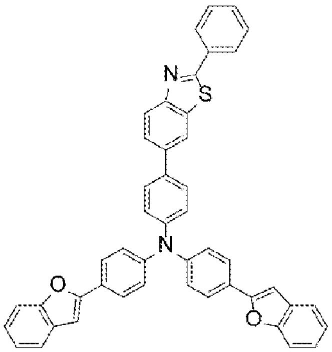
Figure 16:
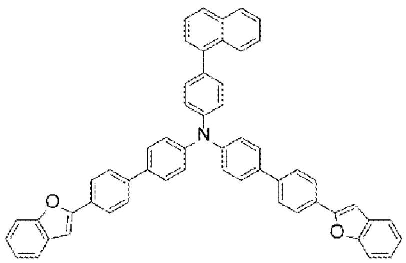
FIG. 16 is a figure showing the structural formulas of the compounds (1-219) to (1-224) as an amine compound represented by the general formula (1) preferably used for an organic EL device of the present invention.
Figure 16:
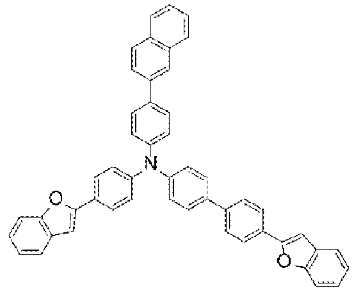
Figure 16:
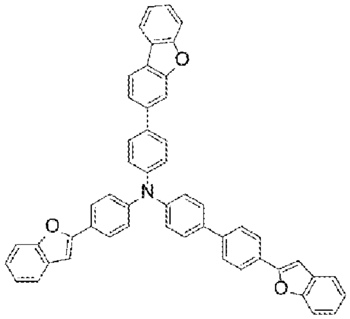
Figure 16:
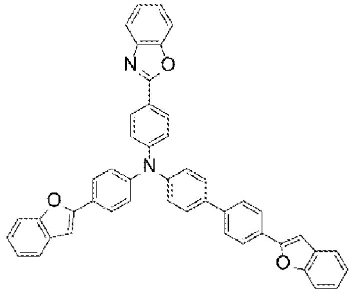
Figure 16:
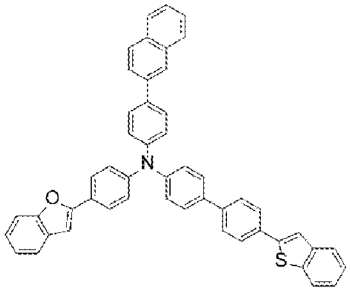
Figure 16:
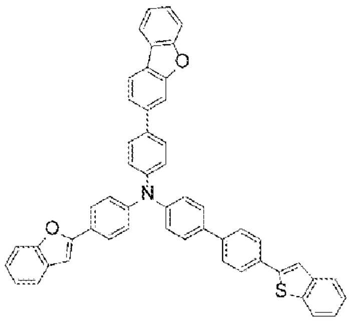
Figure 17:
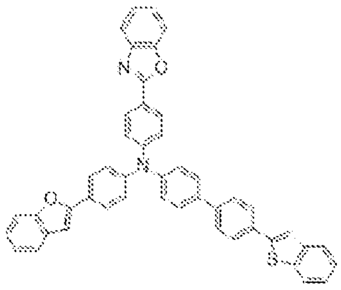
FIG. 17 is a figure showing the structural formulas of the compounds (1-225) as an amine compound represented by the general formula (1) preferably used for an organic EL device of the present invention.

The amine compounds represented by the general formula (1) preferably used in the organic EL devices of the present invention per se can be synthesized according to a known method (see, for example, PTL 4).

The specific examples of the amine compound represented by the general formula (1) preferably used in the organic EL devices of the present invention are showing in FIGS. 1 to 17. The present invention, however, is not restricted to these compounds.

A method for producing the amine compound represented by the general formula (1) preferably used in the organic EL devices of the present invention is not particularly limited, but the purification of the compound can be performed by a known method used for purifying an organic compound such as purification using a column chromatograph, adsorption purification using silica gel, activated carbon, activated clay, or the like, recrystallization or crystallization using a solvent, and finally, purification by a sublimation purification method or the like was performed. The identification of the compound can be performed by an NMR analysis, or the like. It is preferred to measure a melting point, a glass transition point (Tg), a refractive index, and an extinction coefficient as physical property values of the compound.

The melting point and the glass transition point (Tg) can be measured by, for example, a high-sensitive differential scanning calorimeter (DSC3100SA manufactured by Bruker AXS) using a powder.

The refractive index and the extinction coefficient were measured using a spectrometer (F10-RT-UV manufactured by Filmetrics) by preparing a thin film of 80 nm on a silicon substrate.

The organic EL device of the present invention, for example, in the case of a top emission light emitting device, may have a structure including an anode, a hole transport layer, a light emitting layer, an electron transport layer, a cathode, and a capping layer successively formed on a glass substrate, optionally with a hole injection layer between the anode and the hole transport layer, an electron blocking layer between the hole transport layer and the light emitting layer, a hole blocking layer between the light emitting layer and the electron transport layer, and an electron injection layer between the electron transport layer and the cathode. Some of the organic layers in the multilayer structure may be omitted or may serve more than one function. For example, a single organic layer may serve as a hole injection layer and a hole transport layer, a hole transport layer and an electron blocking layer, a hole blocking layer and an electron transport layer, or an electron transport layer and an electron injection layer, and so on. Further, any of the layers may be configured to laminate two or more organic layers having the same function, and the hole transport layer may have a two-layer laminated structure, the light emitting layer may have a two-layer laminated structure, the electron transport layer may have a two-layer laminated structure, the capping layer may have a two-layer laminated structure, and so on.

The total thickness of each layer of the organic EL device is preferably 200 nm to 750 nm, more preferably 350 nm to 600 nm. For example, the thickness of the capping layer is preferably 30 nm to 120 nm, and more preferably 40 nm to 80 nm. In this case, good light extraction efficiency can be obtained. The thickness of the capping layer can be changed according to the type of light-emitting material used in the light-emitting device, the thicknesses of each layer of the organic EL device other than the capping layer, and other factors.

An electrode material with a large work function, such as ITO and gold, may be used as the anode of the organic EL device of the present invention.

The hole injection layer of the organic EL device of the present invention is preferably an arylamine compound having a structure in which two or more triphenylamine structures are joined within a molecule via a single bond or a divalent group that does not contain a heteroatom, for example, an arylamine compound having a structure in which two triphenylamine structures are joined within a molecule via a single bond or a divalent group that does not contain a heteroatom, such as a benzidine derivative, a starburst-type triphenylamine derivative, and various triphenylamine tetramers. A porphyrin compound, such as copper phthalocyanine; an accepting heterocyclic compound, such as hexacyanoazatriphenylene; and a coating-type polymer material may also be used. These materials may be individually deposited for film forming, may be used as a single layer deposited mixed with another material, or may be formed as a laminate of individually deposited layers, a laminate of mixedly deposited layers, or a laminate of the individually deposited layer and the mixedly deposited layer. These materials may be formed into a thin film by a vapor deposition method or other known methods, such as a spin coating method and an inkjet method.

The hole transport layer of the organic EL device of this invention is preferably a benzidine derivative, such as N,N'-diphenyl-N,N'-di(m-tolyl)benzidine (TPD), N,N'-diphenyl-N,N'-di(α-naphthyl)benzidine (NPD), and N,N,N',N'-tetrabiphenylylbenzidine, and 1,1-bis[4-(di-4-tolylamino)phenyl]cyclohexane (TAPC), and particularly an arylamine compound having a structure in which two triphenylamine structures are joined within a molecule via a single bond or a divalent group that does not contain a heteroatom, such as N,N,N',N'-tetrabiphenylylbenzidine. It is also preferable to use an arylamine compound having only one triphenylamine structure within a molecule, an arylamine compound having a structure in which three or more triphenylamine structures are joined within a molecule via a single bond or a divalent group that does not contain a heteroatom, such as various triphenylamine trimers or tetramers and the like. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. In addition, a coating-type polymer material, such as poly(3,4-ethylenedioxythiophene) (PEDOT)/poly(styrene sulfonate) (PSS) may be used as the injection and transport layer of the hole. These materials may be formed into a thin film by a vapor deposition method or other known methods such as a spin coating method and an inkjet method.

The material used for the hole injection layer or the hole transport layer is preferably obtained by p-doping a material commonly used for these layers with trisbromophenylamine hexachloroantimony, a radialene derivative, or the like. A polymer compound having, as a part of the compound structure, a structure of a benzidine derivative, such as TPD, may also be used.

The electron-blocking layer of the organic EL device of the present invention may be a compound having an electron blocking effect, including, for example, a carbazole derivative, such as 4,4',4"-tri(N-carbazolyl)triphenylamine (TCTA), 9,9-bis[4-(carbazol-9-yl)phenyl]fluorene, 1,3-bis(carbazol-9-yl)benzene (mCP), and 2,2-bis(4-carbazol-9-ylphenyl)adamantane (Ad-Cz); and a compound having a triphenylsilyl group and a triarylamine structure, as represented by 9-[4-(carbazol-9-yl)phenyl]-9-[4-(triphenylsilyl)phenyl]-9H-fluorene. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by a vapor deposition method or other known methods such as a spin coating method and an inkjet method.

The light emitting layer of the organic EL device of this invention may be metal complexes of a quinolinol derivative, such as $Alq_3$, as well as various metal complexes, an anthracene derivative, a bis-styrylbenzene derivative, a pyrene derivative, an oxazole derivative, a polyparaphenylene vinylene derivative, etc. Further, the light emitting layer may be made of a host material and a dopant material. An anthracene derivative is preferably used as the host material, but in addition to the light emitting materials above, a heterocyclic compound having an indole ring as a partial structure of the fused ring, heterocyclic compound having a carbazole ring as a partial structure of fused ring, carbazole derivatives, thiazole derivatives, benzimidazole derivatives, polydialkylfluorene derivatives may be used. Further, as the dopant material, quinacridone, coumarin, rubrene, perylene and their derivatives, a benzopyran derivative, a rhodamine derivative, an amino styryl derivative may be used. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer.

Further, the light-emitting material may be a phosphorescent material. Phosphorescent materials as metal complexes of metals such as iridium and platinum may be used. Examples of the phosphorescent materials include green phosphorescent materials such as $Ir(ppy)_3$, blue phosphorescent materials such as FIrpic and $FIr_6$, and red phosphorescent materials such as $Btp_2Ir(acac)$. Here, as the host material, 4,4'-di(N-carbazolyl)biphenyl (CBP), and carbazole derivatives such as TCTA and mCP may be used as the hole injecting and transporting host material. As electron transporting host materials, p-bis(triphenylsilyl)benzene (UGH2), 2,2',2"-(1,3,5-phenylene)-tris(1-phenyl-1H-benzimidazole) (TPBI) may be used. In this way, a high-performance organic EL device can be produced.

To avoid concentration quenching, the doping of the host material with the phosphorescent light-emitting material should preferably be made by co-evaporation in a range of 1 to 30 weight percent with respect to the whole light emitting layer.

Further, Examples of the light-emitting material may be delayed fluorescent-emitting material. These materials may be formed into a thin film by using a vapor deposition method or other known methods such as a spin coating method and an inkjet method.

The hole blocking layer of the organic EL device of the present invention may be formed by using a hole blocking compound, such as phenanthroline derivatives such as bathocuproin (BCP), and the metal complexes of quinolinol derivatives such as aluminum(III) bis(2-methyl-8-quinolinate)-4-phenylphenolate (BAlq), various rare earth complexes, triazole derivatives, triazine derivatives, pyrimidine derivatives, oxadiazole derivatives, and benzazole derivatives. These materials may also serve as the material of the electron transport layer. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by using a vapor deposition method or other known methods such as a spin coating method and an inkjet method.

The electron transport layer of the organic EL device of the present invention may be formed by using various metal complexes, triazole derivatives, triazine derivatives, pyrimidine derivatives, oxadiazole derivatives, pyridine derivatives, benzimidazole derivatives, benzazole derivatives, thiadiazole derivatives, anthracene derivatives, carbodiimide derivatives, quinoxaline derivatives, pyridoindole derivatives, phenanthroline derivatives, and silole derivatives in addition to the metal complexes of quinolinol derivatives such as $Alq_3$ and BAlq. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin film by using a vapor deposition method or other known methods such as a spin coating method and an inkjet method.

Examples of material used for the electron injection layer of the organic EL device of the present invention can be alkali metal salts such as lithium fluoride and cesium fluoride; alkaline earth metal salts such as magnesium fluoride; metal complexes of quinolinol derivatives such as lithium quinolinol; metal oxides such as aluminum oxide; and metals such as ytterbium (Yb), samarium (Sm), calcium (Ca), strontium (Sr), cesium (Cs). However, the electron injection layer may be omitted in the preferred selection of the electron transport layer and the cathode.

Further, in the electron injection layer or the electron transport layer, a material obtained by further N-doping a material which is commonly used for the layer with a metal such as cesium, or the like can be used.

The cathode of the organic EL device of the present invention may be made of an electrode material with a low work function such as aluminum, an alloy with an even lower work function such as a magnesium-silver alloy, magnesium calcium alloys, a magnesium-indium alloy, or an aluminum-magnesium alloy, or ITO or IZO.

The amine compound represented by the above general formula (1), (1-a) or (1-b) is preferably used as the capping layer of the organic EL device of the present invention. These materials may be formed into a thin film by using a vapor deposition method or other known methods such as a spin coating method and an inkjet method.

In the amine compound represented by the general formula (1), (1-a) or (1-b) preferably used in the organic EL devices of the present invention, the refractive index is preferably 1.85 or more within a wavelength range of 450 nm or more and 750 nm or less, more preferably 1.88 or more, and further preferably 1.92 or more.

The above description refers to an organic EL device with a top emission structure, but the invention is not limited to this, and can also be applied to organic EL devices with bottom emission structures, and organic EL devices with dual emission structures that emit light from both the top and the bottom. In these cases, the electrode in the direction from which light is extracted from the light emitting device to the outside must be transparent or translucent.

EXAMPLES

The following describes an embodiment of the present invention in more detail based on Examples. The present invention, however, is not restricted to the following Examples as long as they do not go beyond the gist of the invention.

Example 1

<Synthesis of Compound (1-10)>

To a reaction vessel purged with nitrogen, 147 g of 1-bromo-4-iodobenzene, 61.6 g of 2-benzothiophene boronic acid, 600 mL of toluene, 200 mL of ethanol, and an aqueous solution dissolved 71.7 g of potassium carbonate in 260 mL purified water were added, and aerated with nitrogen gas for 30 minutes. 4.0 g of tetrakis triphenylphosphine palladium was added thereto, and the mixture was stirred under heating to reflux for 14 hours. After the mixture was cooled to room temperature, an organic layer was collected by liquid separation of the reaction solution. The obtained organic layer was heated, and at 80° C., 50 g of silica gel was added thereto, then the mixture was stirred for 1 hour. The silica gel was removed by hot filtration, the obtained filtrate was concentrated. 300 mL of heptane was added to the residue, and the mixture was stirred at room temperature for 1 hour, and the obtained solid was collected by filtration, whereby 54.8 g of a yellowish white powder of 2-(4-bromophenyl)benzothiophene (yield: 54.8%) was obtained.

The obtained 18.0 g of 2-(4-bromophenyl)benzothiophene, 7.6 g of 4-(9-phenanthrenyl)benzenamine, 180 mL of toluene, and 10.2 g of tert-butoxy sodium were added to a reaction vessel purged with nitrogen, and aerated with nitrogen gas for 30 minutes. 0.5 g of tris(dibenzylideneacetone)dipalladium, and 2.2 g of a toluene solution containing 50% (w/v) tri-tert-butylphosphine were added to the mixture, the mixture was stirred under heating to reflux for 8 hours. After the mixture was cooled to room temperature, 90 mL of methanol was added to the mixture, and the precipitated solid was collected by filtration. 80 mL of methanol, and 80 mL of water were added to the obtain solid, the mixture was stirred under heating to reflux for 1 hour. The precipitated solid was collected by filtration, and 400 mL of chlorobenzene was added, then the mixture was heated to 100° C. to dissolve the solid, 8 g of silica gel, and 8 g of activated clay were added, and the mixture was stirred for 1 hour. The solid was removed by hot filtration, the obtained resulting filtrate was concentrated. 180 mL of methanol was added to the residue, and the mixture was stirred under heating to reflux for 1 hour, whereby 10.5 g of a yellow powder of Compound (1-10) (yield: 54.1%) was obtained.

[Chemical Formula 7]

(1-10)

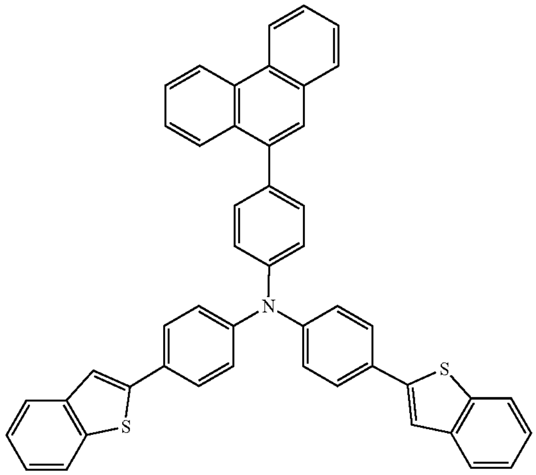

The structure of the obtained yellow powder was identified by NMR.

The $^1$H-NMR (THF-$d_8$) detected 31 hydrogen signals, as follows.

δ (ppm)=8.80-8.93 (2H), 8.08-8.10 (1H), 7.96-7.98 (1H), 7.86-7.88 (2H), 7.57-7.81 (15H), 7.29-7.40 (10H).

Example 2

<Synthesis of Compound (1-34)>

The same operation as in Example 1 was performed except that 4-(9-phenanthrenyl)benzenamine was replaced with 4-(3-dibenzofuranyl)benzenamine, whereby 9.7 g of a yellow powder of Compound (1-34) (yield: 53%) was obtained.

[Chemical Formula 8]

(1-34)

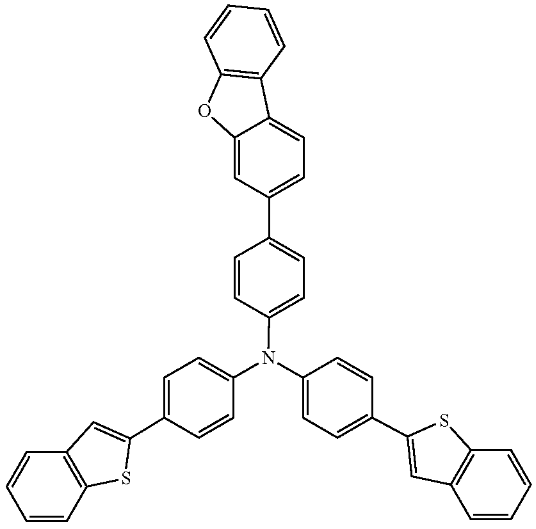

The structure of the obtained yellow powder was identified by NMR.

The $^1$H-NMR ($CDCl_3$) detected 29 hydrogen signals, as follows.

δ (ppm)=7.94-7.98 (2H), 7.73-7.79 (5H), 7.56-7.64 (8H), 7.43-7.47 (3H), 7.16-7.36 (11H).

Example 3

Synthesis of Compound (1-7)

The same operation as in Example 1 was performed except that 4-(9-phenanthrenyl)benzenamine was replaced with 4-amino-p-terphenyl, whereby 7.5 g of a yellow powder of Compound (1-7) (yield: 93%) was obtained.

[Chemical Formula 9]

(1-7)

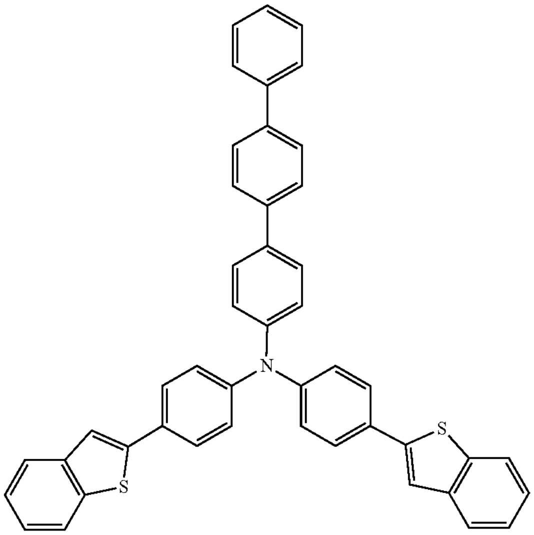

The structure of the obtained yellow powder was identified by NMR.

The $^1$H-NMR ($CDCl_3$) detected 31 hydrogen signals, as follows.

δ (ppm)=7.81 (2H), 7.75 (2H), 7.67 (4H), 7.66-7.63 (6H), 7.59 (2H), 7.48-7.44 (4H), 7.38-7.24 (7H), 7.21 (4H).

Example 4

<Synthesis of Compound (1-29)>

The same operation as in Example 1 was performed except that 4-(9-phenanthrenyl)benzenamine was replaced with 4-(2-benzothiazolyl)benzenamine, whereby 10.4 g of a yellow powder of Compound (1-29) (yield: 61%) was obtained.

[Chemical Formula 10]

(1-29)

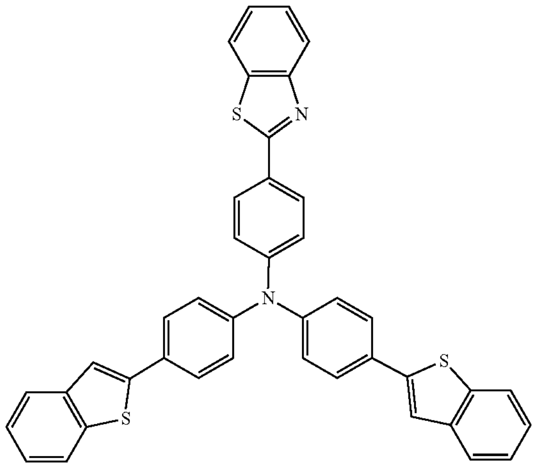

The structure of the obtained yellow powder was identified by NMR.

The $^1H$-NMR ($CDCl_3$) detected 26 hydrogen signals, as follows.

δ (ppm)=8.04 (1H), 8.00 (2H), 7.89 (1H), 7.28 (2H), 7.77 (2H), 7.66 (4H), 7.51 (2H), 7.48 (1H), 7.40-7.28 (5H), 7.27-7.21 (6H).

Example 5

<Synthesis of Compound (1-32)>

The same reaction in Example 1 was performed except that 4-(9-phenanthrenyl)benzenamine was replaced with 4-(1-dibenzofuranyl)benzenamine. After the solid was collected, the solid was purified by crystallization with tetrahydrofuran and acetone, whereby 5.1 g of a yellow powder of Compound (1-32) (yield: 65%) was obtained.

[Chemical Formula 11]

(1-32)

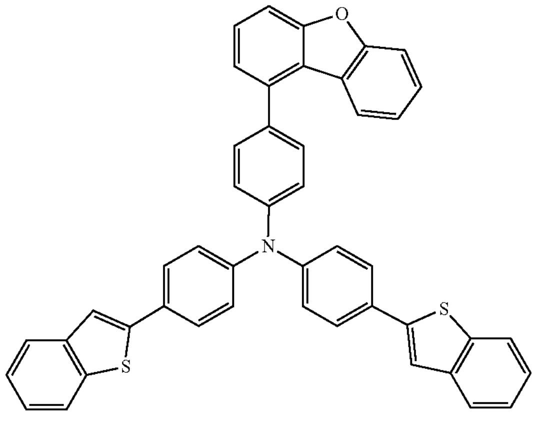

The structure of the obtained yellow powder was identified by NMR.

The $^1H$-NMR ($CDCl_3$) detected 29 hydrogen signals, as follows.

δ (ppm)=7.82 (2H), 7.77 (2H), 7.72 (1H), 7.68 (4H), 7.60-7.56 (4H), 7.52-7.48 (3H), 7.44 (1H), 7.37-7.28 (11H), 7.22 (1H).

Example 6

<Synthesis of Compound (1-33)>

The same reaction in Example 1 was performed except that 4-(9-phenanthrenyl)benzenamine was replaced with 4-(2-dibenzofuranyl)benzenamine. After the solid was collected, the solid was purified by crystallization with tetrahydrofuran and acetone, whereby 10.2 g of a yellow powder of Compound (1-33) (yield: 66%) was obtained.

[Chemical Formula 12]

(1-33)

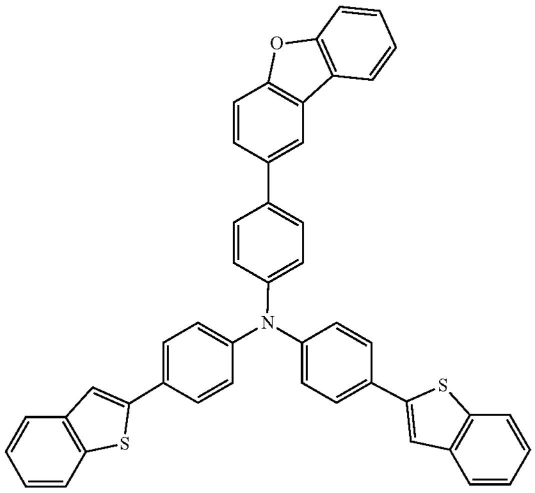

The structure of the obtained yellow powder was identified by NMR.

The $^1H$-NMR ($CDCl_3$) detected 29 hydrogen signals, as follows.

δ (ppm)=8.16 (1H), 8.01 (1H), 7.82 (2H), 7.76 (2H), 7.71-7.59 (9H), 7.51-7.47 (3H), 7.39-7.28 (7H), 7.23 (4H).

Example 7

<Synthesis of Compound (1-35)>

The same reaction in Example 1 was performed except that 4-(9-phenanthrenyl)benzenamine was replaced with 4-(4-dibenzofuranyl)benzenamine. After the solid was collected, the solid was purified by crystallization with tetrahydrofuran and acetone, whereby 11.1 g of a yellow powder of Compound (1-35) (yield: 66%) was obtained.

[Chemical Formula 13]

(1-35)

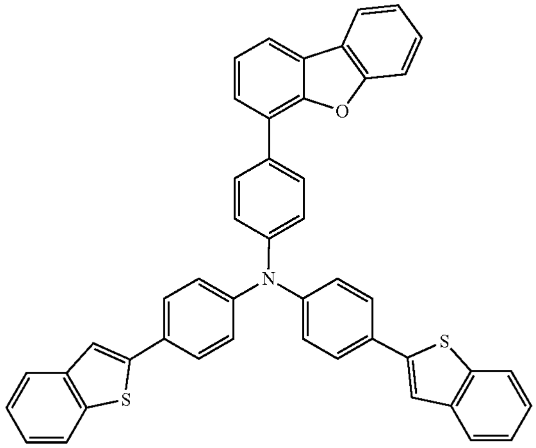

The structure of the obtained yellow powder was identified by NMR.

The $^{1}H$-NMR ($CDCl_3$) detected 29 hydrogen signals, as follows.

δ (ppm)=8.00 (1H), 7.93 (1H), 7.91 (2H), 7.83 (2H), 7.77 (2H), 7.67 (4H), 7.63 (2H), 7.50 (2H), 7.48-7.42 (2H), 7.39-7.26 (11H).

Example 8

<Synthesis of Compound (1-37)>

The same reaction in Example 1 was performed except that 4-(9-phenanthrenyl)benzenamine was replaced with 4-(2-dibenzothienyl)benzenamine. After the solid was collected, the solid was purified by crystallization with tetrahydrofuran and acetone, whereby 10.2 g of a yellow powder of Compound (1-37) (yield: 45%) was obtained.

[Chemical Formula 14]

(1-37)

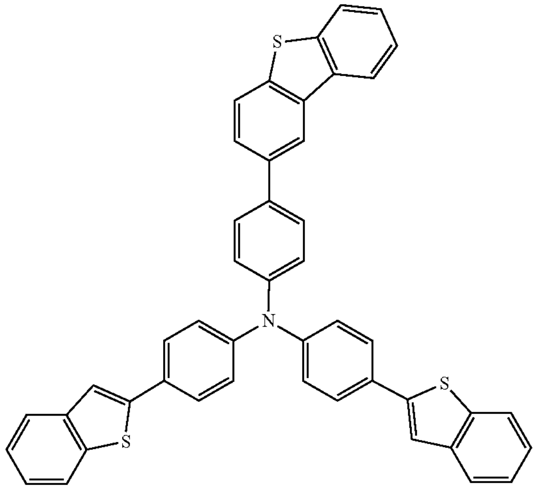

The structure of the obtained yellow powder was identified by NMR.

The $^{1}H$-NMR ($CDCl_3$) detected 29 hydrogen signals, as follows.

δ (ppm)=8.36 (1H), 8.23 (1H), 7.92 (1H), 7.88 (1H), 7.83 (2H), 7.77 (2H), 7.71 (1H), 7.68-7.65 (6H), 7.52-7.48 (5H), 7.38-7.23 (9H)

Example 9

<Synthesis of Compound (1-39)>

The same operation as in Example 1 was performed except that 4-(9-phenanthrenyl)benzenamine was replaced with 4-(4-dibenzothienyl)benzenamine, whereby 6.6 g of a yellow powder of Compound (1-39) (yield: 88%) was obtained.

[Chemical Formula 15]

(1-39)

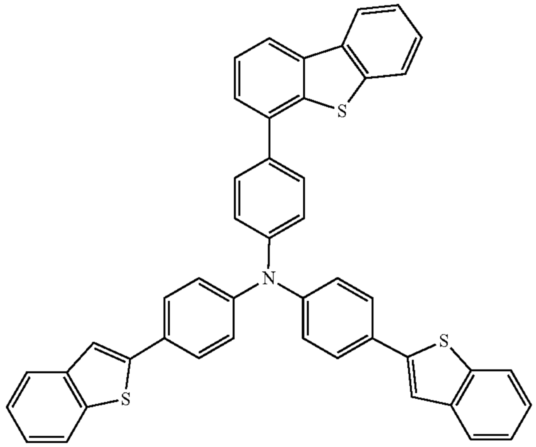

The structure of the obtained yellow powder was identified by NMR.

The $^{1}H$-NMR ($CDCl_3$) detected 29 hydrogen signals, as follows.

δ (ppm)=8.20 (1H), 8.16 (1H), 7.86 (1H), 7.83 (2H), 7.77 (2H), 7.71 (2H), 7.67 (4H), 7.57 (1H), 7.53-7.47 (5H), 7.37-7.26 (10H).

Example 10

Synthesis of Compound (1-87)

The same reaction in Example 1 was performed except that 4-(9-phenanthrenyl)benzenamine was replaced with 4-(4-dibenzothienyldibenzothiophene) naphthalene-1-yl-amine. After the solid was collected, the solid was purified by crystallization with a toluene/acetone mixed solvent whereby 6.6 g of a yellow powder of Compound (1-87) (yield: 64%) was obtained.

[Chemical Formula 16]

(1-87)

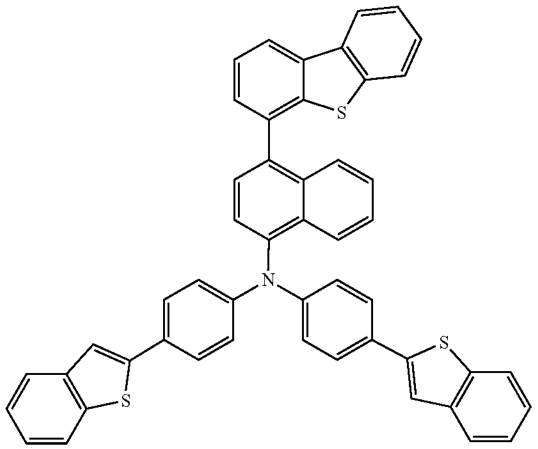

The structure of the obtained yellow powder was identified by NMR.

The $^{1}$H-NMR ($CDCl_3$) detected 31 hydrogen signals, as follows.

δ (ppm)=8.28 (1H), 8.25 (1H), 8.08 (1H), 7.81 (2H), 7.78 (1H), 7.76-7.72 (3H), 7.68 (1H), 7.66-7.62 (5H), 7.57 (1H), 7.53-7.50 (2H), 7.49-7.44 (4H), 7.42-7.26 (5H), 7.21 (4H).

Example 11

15<Synthesis of Compound (1-95)>

To a reaction vessel purged with nitrogen, 4.5 g of 4-(2-naphthyl)benzenamine, 68 mL of xylene, 14.6 g of 2-(7-bromonaphthalene-2-yl)benzothiophene, 4.9 g of tert-butoxy sodium, 0.2 g tris(dibenzylideneacetone)dipalladium, and 0.2 g a toluene solution containing 50% (w/v) tri-tert-butylphosphine were added, then, the mixture was stirred under heating to reflux overnight. After the mixture was cooled to room temperature, methanol was added to the mixture, and the precipitated solid was collected by filtration. The obtained solid was purified by crystallization with a chlorobenzene/acetone mixed solvent, whereby 2.9 g of a yellow powder of Compound (1-95) (yield: 19%) was obtained.

[Chemical Formula 17]

(1-95)

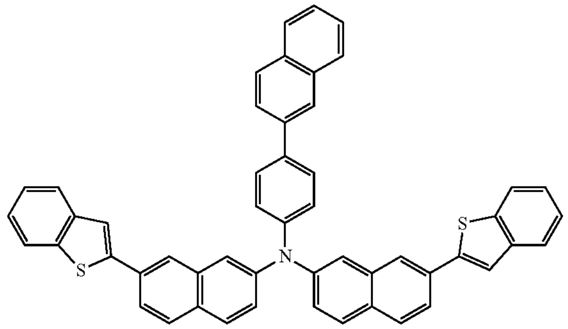

The structure of the obtained yellow powder was identified by NMR.

The $^{1}$H-NMR ($CDCl_3$) detected 33 hydrogen signals, as follows.

δ (ppm)=8.17 (2H), 7.96 (2H), 7.91-7.73 (13H), 7.65 (4H), 7.57 (1H), 7.40 (2H), 7.38-7.27 (9H).

Example 12

<Synthesis of Compound (1-96)>

The same operation as in Example 11 was performed except that 4-(2-naphthyl)benzenamine was replaced with 4-(2-benzoxazolyl)benzenamine, whereby 5.5 g of a yellow powder of Compound (1-96) (yield: 35%) was obtained.

[Chemical Formula 18]

(1-96)

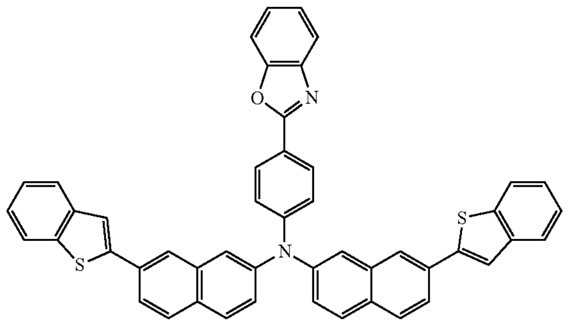

The structure of the obtained yellow powder was identified by NMR.

The $^{1}$H-NMR ($CDCl_3$) detected 30 hydrogen signals, as follows.

δ (ppm)=8.07 (1H), 7.95 (2H), 7.94-7.74 (13H), 7.70 (2H), 7.64 (2H), 7.62 (1H), 7.50 (2H), 7.42 (2H), 7.38-7.27 (5H).

Example 13

<Synthesis of Compound (1-211)>

The same operation as in Example 11 was performed except that 4-(2-naphthyl)benzenamine was replaced with 4-(3-dibenzofuranyl)benzenamine, whereby 8.9 g of a yellow powder of Compound (1-211) (yield: 74%) was obtained.

[Chemical Formula 19]

(1-211)

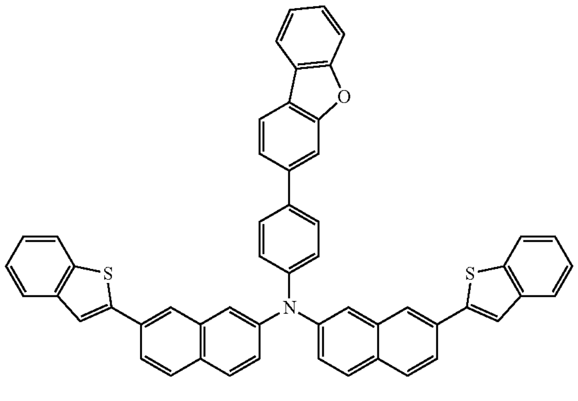

The structure of the obtained yellow powder was identified by NMR.

The $^{1}H$-NMR ($CDCl_3$) detected 33 hydrogen signals, as follows.

δ (ppm)=8.00 (1H), 7.97 (1H), 7.95 (2H), 7.83 (6H), 7.77 (5H), 7.64 (7H), 7.79 (1H), 7.46 (1H), 7.42 (2H), 7.39-7.27 (7H).

Example 14

<Synthesis of Compound (1-152)>

To a reaction vessel purged with nitrogen, 5.0 g of 4-(2-naphthyl)benzenamine, 100 mL of toluene, 13.7 g of 2-(4-bromophenyl)benzofuran, 6.6 g of tert-butoxy sodium, 0.8 g of tris(dibenzylideneacetone)dipalladium, and 0.8 g of a toluene solution containing 50% (w/v) tri-tert-butylphosphine were added, then, the mixture was stirred under heating to reflux overnight. After the mixture was cooled to room temperature, methanol was added to the mixture, and the precipitated solid was collected by filtration. The obtained solid was purified by crystallization with tetrahydrofuran and acetone, whereby 8.2 g of a yellow powder of Compound (1-152) (yield: 53%) was obtained.

[Chemical Formula 20]

(1-152)

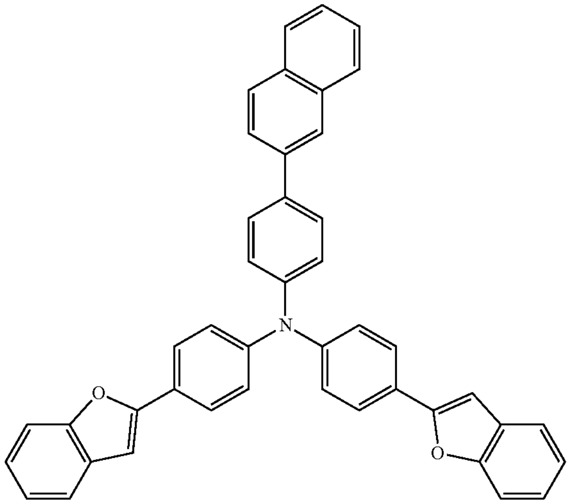

The structure of the obtained yellow powder was identified by NMR.

The $^{1}H$-NMR ($CDCl_3$) detected 29 hydrogen signals, as follows.

δ (ppm)=8.05 (1H), 7.90 (2H), 7.86 (1H), 7.79 (4H), 7.76 (1H), 7.68 (2H), 7.57 (2H), 7.52 (2H), 7.49 (2H), 7.32-7.19 (10H), 6.95 (2H).

Example 15

<Synthesis of Compound (1-153)>

The same operation as in Example 14 was performed except that 4-(2-naphthyl)benzenamine was replaced with 4-(9-phenanthrenyl)benzenamine, whereby 3.4 g of a yellow powder of Compound (1-153) (yield: 31%) was obtained.

[Chemical Formula 21]

(1-153)

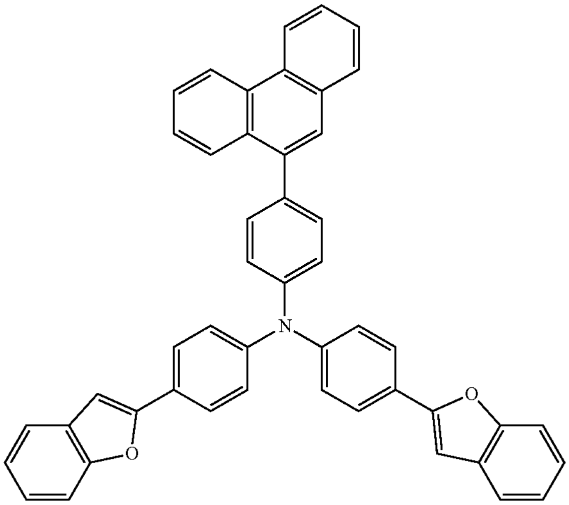

The structure of the obtained yellow powder was identified by NMR.

The $^{1}H$-NMR ($CDCl_3$) detected 31 hydrogen signals, as follows.

δ (ppm)=8.80 (1H), 8.74 (1H), 8.07 (1H), 7.92 (1H), 7.83 (4H), 7.75 (1H), 7.73-7.58 (6H), 7.54-7.51 (4H), 7.34-7.22 (10H), 6.97 (2H).

Example 16

20<Synthesis of Compound (1-154)>

The same reaction in Example 14 was performed except that 4-(2-naphthyl)benzenamine was replaced with 4-(2-benzoxazolyl)benzenamine. After the solid was collected, the solid was purified by crystallization with a chlorobenzene/acetone mixed solvent, whereby 10.7 g of a yellow powder of Compound (1-154) (yield: 75%) was obtained.

[Chemical Formula 22]

(1-154)

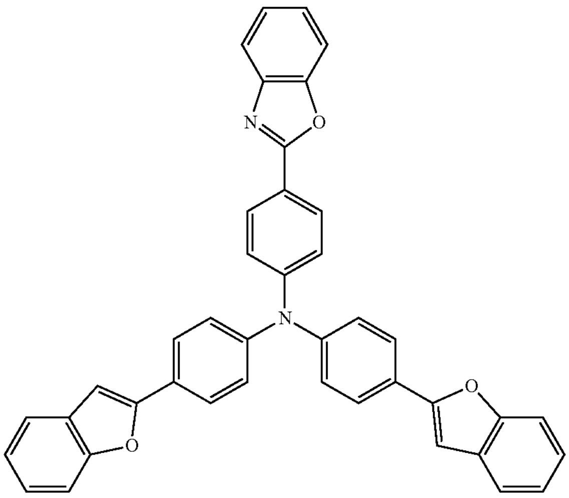

The structure of the obtained yellow powder was identified by NMR.

The $^1$H-NMR ($CDCl_3$) detected 26 hydrogen signals, as follows.

δ (ppm)=8.15 (2H), 7.83 (4H), 7.76 (1H), 7.58 (3H), 7.52 (2H), 7.34 (2H), 7.32-7.21 (10H), 6.99 (2H).

Example 17

<Synthesis of Compound (1-158)>

The same operation as in Example 14 was performed except that 4-(2-naphthyl)benzenamine was replaced with 4-(2-dibenzofuranyl)benzenamine, whereby 3.8 g of a yellow powder of Compound (1-158) (yield: 31%) was obtained.

[Chemical Formula 23]

(1-158)

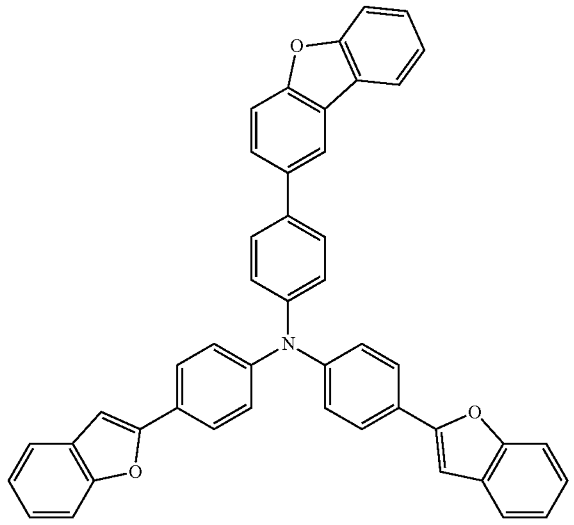

The structure of the obtained yellow powder was identified by NMR.

The $^1$H-NMR ($CDCl_3$) detected 29 hydrogen signals, as follows.

δ (ppm)=8.16 (1H), 8.01 (1H), 7.79 (4H), 7.70 (1H), 7.64-7.57 (6H), 7.53-7.47 (3H), 7.38 (1H), 7.30-7.21 (10H), 6.96 (2H).

Example 18

<Synthesis of Compound (1-160)>

The same operation as in Example 14 was performed except that 4-(2-naphthyl)benzenamine was replaced with 4-(2-dibenzothienyl)benzenamine, whereby 6.7 g of a yellow powder of Compound (1-160) (yield: 40%) was obtained.

[Chemical Formula 24]

(1-160)

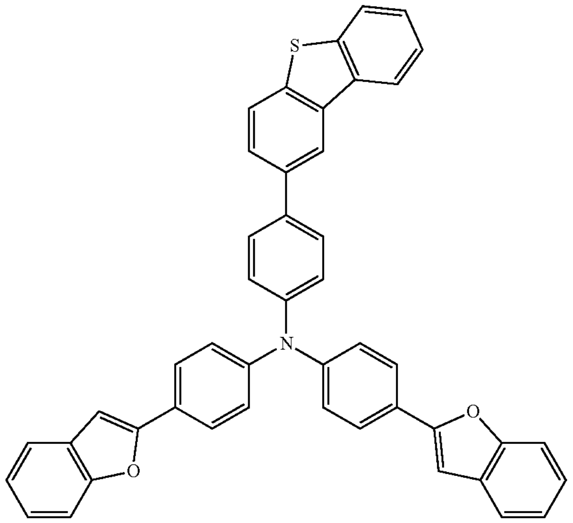

The structure of the obtained yellow powder was identified by NMR.

The $^1$H-NMR ($CDCl_3$) detected 29 hydrogen signals, as follows.

δ (ppm)=8.36 (1H), 8.22 (1H), 7.91 (1H), 7.87 (1H), 7.79 (4H), 7.70 (1H), 7.66 (1H), 7.57 (2H), 7.52 (2H), 7.48 (2H), 7.30-7.21 (11H), 6.95 (2H).

Example 19

<Synthesis of Compound (1-161)>

The same operation as in Example 14 was performed except that 4-(2-naphthyl)benzenamine was replaced with 4-(4-dibenzothienyl)benzenamine, whereby 4.5 g of a yellow powder of Compound (1-161) (yield: 42%) was obtained.

[Chemical Formula 25]

(1-161)

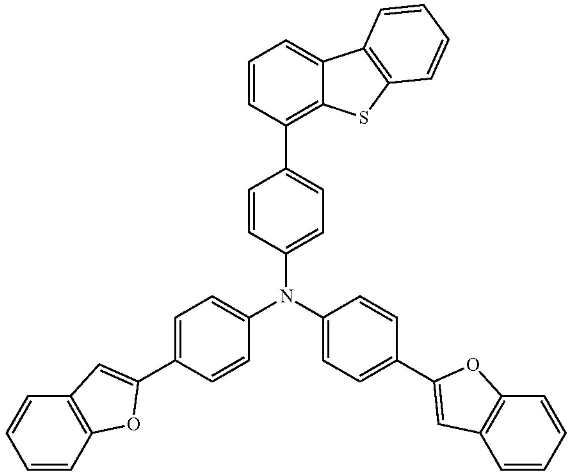

The structure of the obtained yellow powder was identified by NMR.

The $^1$H-NMR ($CDCl_3$) detected 29 hydrogen signals, as follows.

δ (ppm)=8.20 (1H), 8.15 (1H), 7.86 (1H), 7.81 (4H), 7.71 (2H), 7.58-7.51 (6H), 7.47 (2H), 7.33-7.21 (10H), 6.96 (2H).

Example 20

<Synthesis of Compound (1-166)>

The same operation as in Example 14 was performed except that 4-(2-naphthyl)benzenamine was replaced with 4-(3-quinolyl)benzenamine, whereby 10.7 g of a yellow powder of Compound (1-166) (yield: 75%) was obtained.

[Chemical Formula 26]

(1-166)

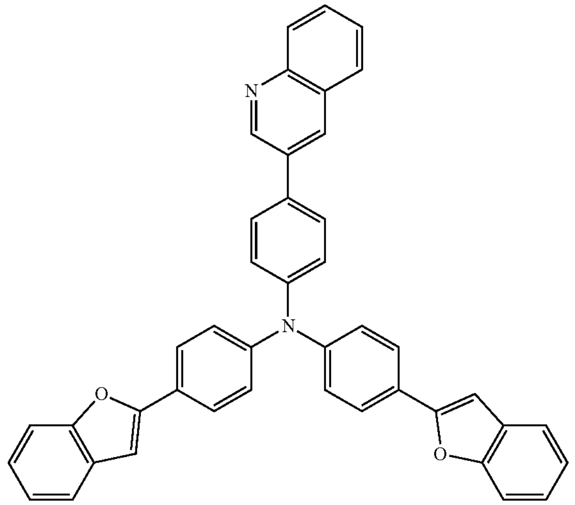

The structure of the obtained yellow powder was identified by NMR.

$^1$H-NMR ($CDCl_3$) detected 28 hydrogen signals, as follows. δ (ppm)=9.21 (1H), 8.30 (1H), 8.14 (1H), 7.89 (1H), 7.80 (4H), 7.72 (1H), 7.67 (2H), 7.58 (1H), 7.57 (2H), 7.52 (2H), 7.32 (2H), 7.31-7.20 (8H), 6.96 (2H).

Example 21

<Synthesis of Compound (1-212)>

The same operation as in Example 14 was performed except that 4-(2-naphthyl)benzenamine was replaced with 4-amino-p-terphenyl, whereby 9.2 g of a yellow powder of Compound (1-212) (yield: 60%) was obtained.

[Chemical Formula 27]

(1-212)

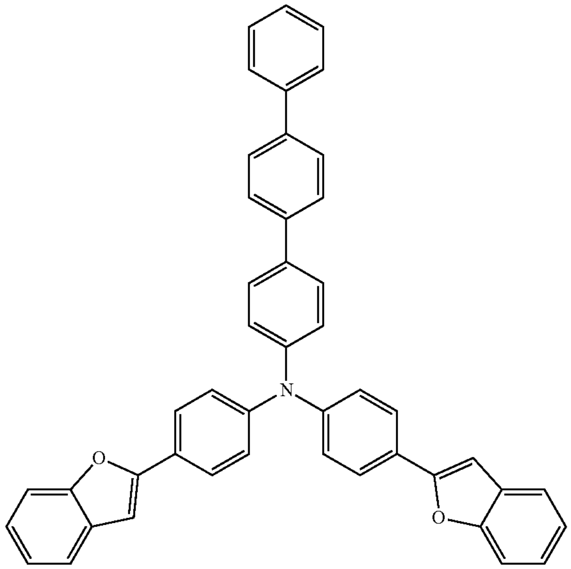

The structure of the obtained yellow powder was identified by NMR.

The $^1$H-NMR ($CDCl_3$) detected 31 hydrogen signals, as follows.

δ (ppm)=7.79 (4H), 7.68 (4H), 7.65 (2H), 7.59 (4H), 7.51 (2H), 7.47 (2H), 7.36 (1H), 7.29-7.21 (10H), 6.95 (2H).

Example 22

<Synthesis of Compound (1-213)>

The same operation as in Example 14 was performed except that 4-(2-naphthyl)benzenamine was replaced with 4-(3-dibenzofuranyl)benzenamine, whereby 5.1 g of a yellow powder of Compound (1-213) (yield: 52%) was obtained.

[Chemical Formula 28]

(1-213)

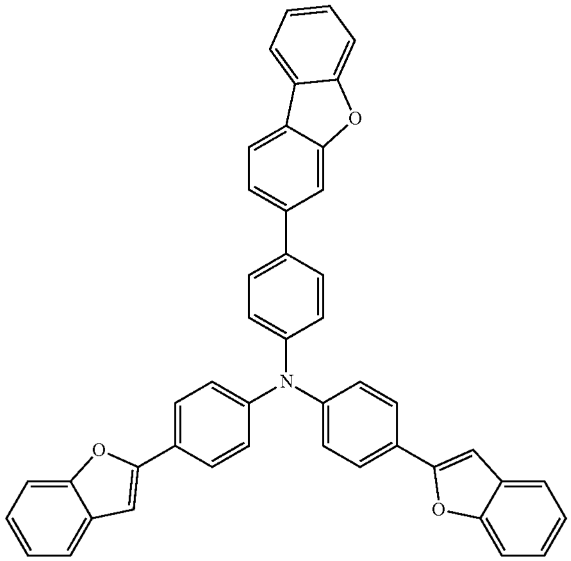

The structure of the obtained yellow powder was identified by NMR.

The $^1$H-NMR ($CDCl_3$) detected 29 hydrogen signals, as follows.

δ (ppm)=8.00 (1H), 7.97 (1H), 7.81-7.79 (5H), 7.66-7.57 (6H), 7.52 (2H), 7.47 (1H), 7.37 (1H), 7.30-7.21 (10H), 6.96 (2H).

Example 23

<Synthesis of Compound (1-214)>

The same operation as in Example 14 was performed except that 4-(2-naphthyl)benzenamine was replaced with 4'-benzofuran-2-yl-biphenyl-4-yl-amine, whereby 11.4 g of a pale yellow powder of Compound (1-214) (yield: 81%) was obtained.

[Chemical Formula 29]

(1-214)

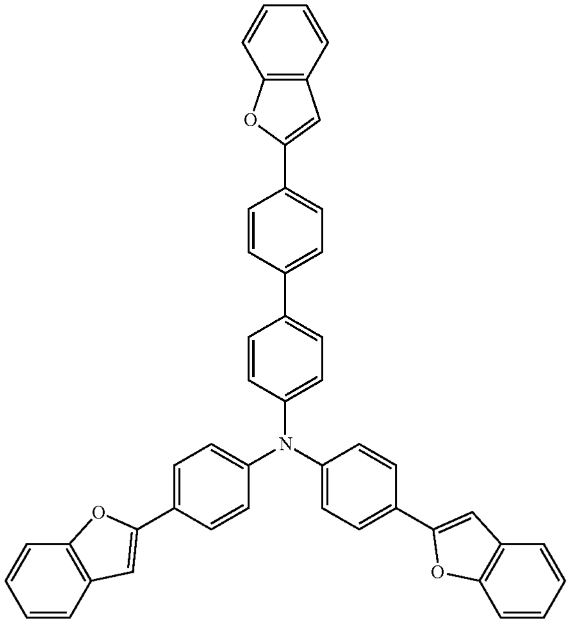

The structure of the obtained pale yellow powder was identified by NMR.

The $^1$H-NMR ($CDCl_3$) detected 31 hydrogen signals, as follows.

δ (ppm)=7.95 (2H), 7.80 (4H), 7.70 (2H), 7.62-7.51 (8H), 7.34-7.21 (12H), 7.07 (1H), 6.96 (2H).

Example 24

<Synthesis of Compound (1-215)>

The same operation as in Example 14 was performed except that 4-(2-naphthyl)benzenamine was replaced with 4'-benzoxazole-2-yl-biphenyl-4-yl-amine, whereby 7.2 g of a yellow powder of Compound (1-215) (yield: 72%) was obtained.

[Chemical Formula 30]

(1-215)

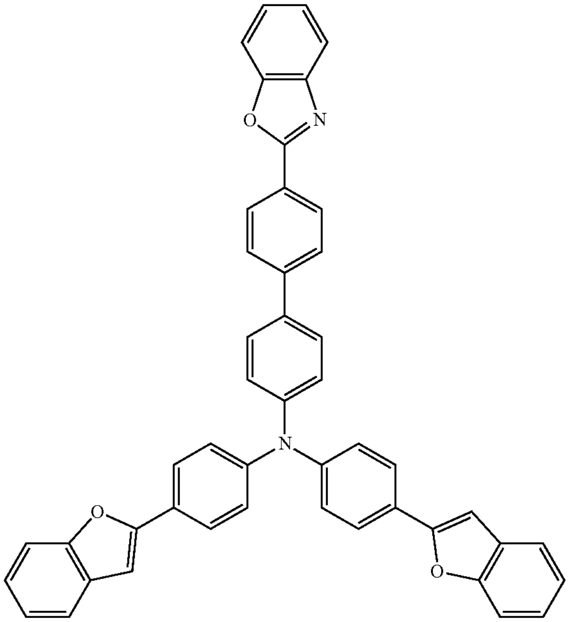

The structure of the obtained yellow powder was identified by NMR.

The $^1$H-NMR ($CDCl_3$) detected 30 hydrogen signals, as follows.

δ (ppm)=8.33 (2H), 7.81-7.76 (7H), 7.64-7.51 (7H), 7.38-7.36 (2H), 7.30-7.21 (10H), 6.96 (2H).

Example 25

<Synthesis of Compound (1-216)>

The same reaction in Example 14 was performed except that 4-(2-naphthyl)benzenamine was replaced with 4-(2-phenyl-benzoxazole-6-yl)benzenamine. After the solid was collected, the solid was purified by recrystallization with chlorobenzene, whereby 14.3 g of a yellow powder of Compound (1-216) (yield: 70%) was obtained.

[Chemical Formula 31]

(1-216)

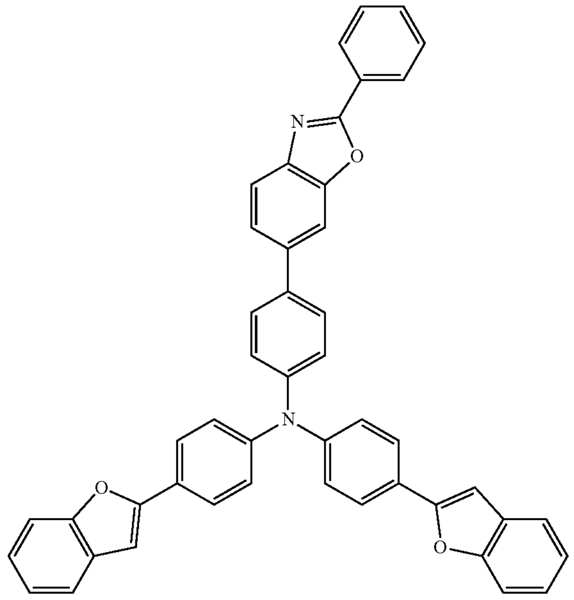

The structure of the obtained yellow powder was identified by NMR.

The $^{1}$H-NMR ($CDCl_3$) detected 30 hydrogen signals, as follows.

δ (ppm)=8.28 (2H), 7.80 (6H), 7.65-7.54 (8H), 7.52 (2H), 7.31-7.20 (10H), 6.96 (2H).

Example 26

Synthesis of Compound (1-217)

The same reaction in Example 14 was performed except that 4-(2-naphthyl)benzenamine was replaced with 4'-(2-phenyl-benzoxazole-6-yl) biphenyl-4-yl-amine. After the solid was collected, the solid was purified by recrystallization with chlorobenzene, whereby 5.4 g of a yellow powder of Compound (1-217) (yield: 53%) was obtained.

[Chemical Formula 32]

(1-217)

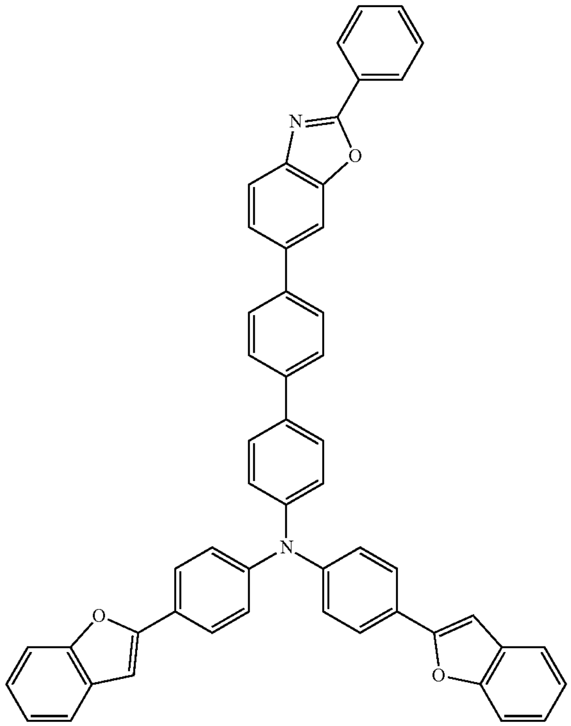

The structure of the obtained yellow powder was identified by NMR.

The $^{1}$H-NMR ($CDCl_3$) detected 34 hydrogen signals, as follows.

δ (ppm)=8.29 (2H), 7.84 (2H), 7.79 (4H), 7.72 (4H), 7.66 (1H), 7.61 (2H), 7.56 (5H), 7.52 (2H), 7.32-7.20 (10H), 6.95 (2H).

Example 27

<Synthesis of Compound (1-218)>

The same reaction in Example 14 was performed except that 4-(2-naphthyl)benzenamine was replaced with 4-(2-phenyl-benzothiazole-6-yl)benzenamine. After the solid was collected, the solid was purified by crystallization with chlorobenzene, whereby 7.6 g of a yellow powder of Compound (1-218) (yield: 80%) was obtained.

[Chemical Formula 33]

(1-218)

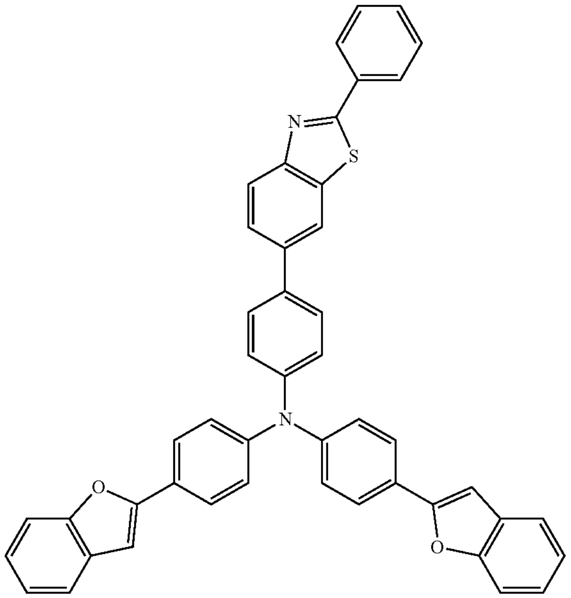

The structure of the obtained yellow powder was identified by NMR.

The $^1$H-NMR ($CDCl_3$) detected 30 hydrogen signals, as follows.

δ (ppm)=8.12 (4H), 7.79 (4H), 7.73 (1H), 7.61 (2H), 7.57 (2H), 7.51 (5H), 7.32-7.19 (10H), 6.95 (2H).

Example 28

Synthesis of Compound (1-219)

To a reaction vessel purged with nitrogen, 5.2 g of 4-(naphthalene-1-yl)benzenamine, 160 mL of toluene, 16.6 g of 2-(4'-chloro biphenyl)benzofuran, 6.8 g of tert-butoxy sodium, 0.9 g of tris(dibenzylideneacetone)dipalladium, and 0.8 g of a toluene solution containing 50% (w/v) tri-tert-butylphosphine were added, and the mixture was stirred under heating to reflux overnight. After the mixture was cooled to room temperature, methanol was added to the reaction solution, and the solid was collected by filtration. The obtained solid was purified by crystallization with monochlorobenzene and acetone, whereby 11.1 g of a yellow powder of Compound (1-219) (yield: 63%) was obtained.

[Chemical Formula 34]

(1-219)

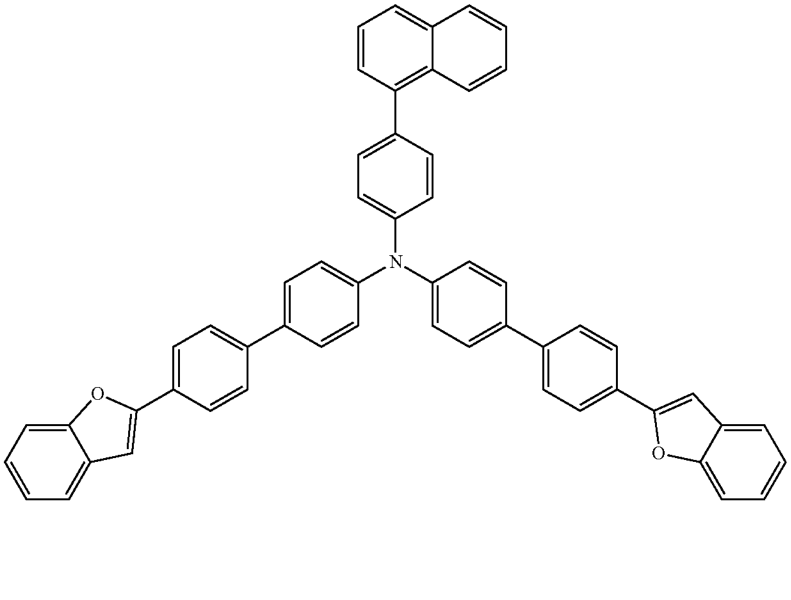

The structure of the obtained yellow powder was identified by NMR.

The $^1$H-NMR (THF-$d_8$) detected 37 hydrogen signals, as follows.

δ (ppm)=8.02 (1H), 7.98 (4H), 7.91 (1H), 7.85 (1H), 7.77 (4H), 7.70 (4H), 7.58 (2H), 7.53-7.44 (8H), 7.31 (6H), 7.28-7.20 (6H).

Example 29

<Synthesis of Compound (1-220)>

To a reaction vessel purged with nitrogen, 30.0 g of 4-(2-naphthyl)benzenamine, 300 mL of toluene, 37.4 g of 2-(4-bromophenyl)benzofuran, 26.3 g of tert-butoxy sodium, 2.5 g of tris(dibenzylideneacetone)dipalladium, and 1.7 g of 2,2'-bis(diphenylphosphino)-1,1'-binaphthyl were added, and the mixture was stirred under heating to reflux overnight. After the mixture was cooled to room temperature, methanol was added to the mixture, and the precipitated solid was collected by filtration. The obtained solid was purified by crystallization with a chlorobenzene/acetone mixed solvent, whereby 39.4 g of a yellow powder of (4-benzofuran-2-yl-phenyl)-(4-naphthalene-2-yl-phenyl) amine (yield: 70%) was obtained.

The obtained 7.5 g of (4-benzofuran-2-yl-phenyl)-(4-naphthalene-2-yl-phenyl)amine, 80 mL of xylene, 6.1 g of 2-(4'-chlorobiphenyl-4-yl)benzofuran, 3.5 g of tert-butoxy sodium, 0.2 g of tris(dibenzylideneacetone)dipalladium, and 0.4 of a toluene solution containing 50% (w/v) tri-tert-butylphosphine were added to a reaction vessel purged with nitrogen, then, the mixture was stirred under heating to reflux overnight. After the mixture was cooled to room temperature, methanol was added to the mixture, and the precipitated solid was collected by filtration. The obtained solid was purified by crystallization with a tetrahydrofuran/acetone mixed solvent, whereby 10.6 g of a yellow powder of Compound (1-220) (yield: 85%) was obtained.

[Chemical Formula 35]

(1-220)

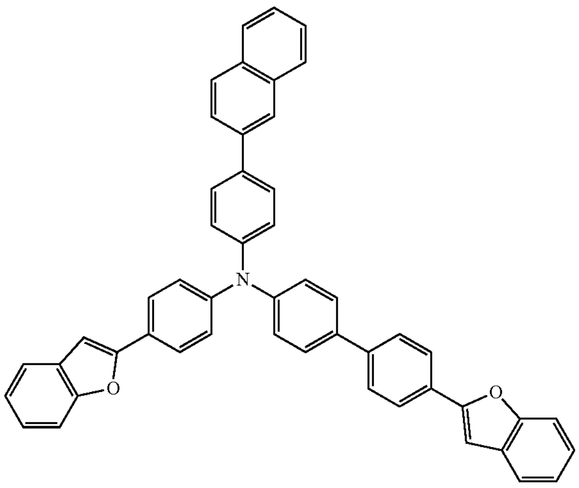

The structure of the obtained yellow powder was identified by NMR.

The $^1$H-NMR ($CDCl_3$) detected 33 hydrogen signals, as follows.

δ (ppm)=8.05 (1H), 7.95-7.86 (5H), 7.80-7.75 (3H), 7.71-7.68 (4H), 7.60 (4H), 7.56 (1H), 7.53-7.46 (4H), 7.37-7.21 (9H), 7.07 (1H), 6.95 (1H).

Example 30

<Synthesis of Compound (1-221)>

The same operation as in Example 29 was performed except that (4-benzofuran-2-yl-phenyl)-(4-naphthalene-2-yl-phenyl)amine was replaced with (4-benzofuran-2-yl-phenyl)-(4-dibenzofuran-3-yl-phenyl)amine, whereby 7.4 g of a yellow powder of Compound (1-221) (yield: 69%) was obtained.

[Chemical Formula 36]

(1-221)

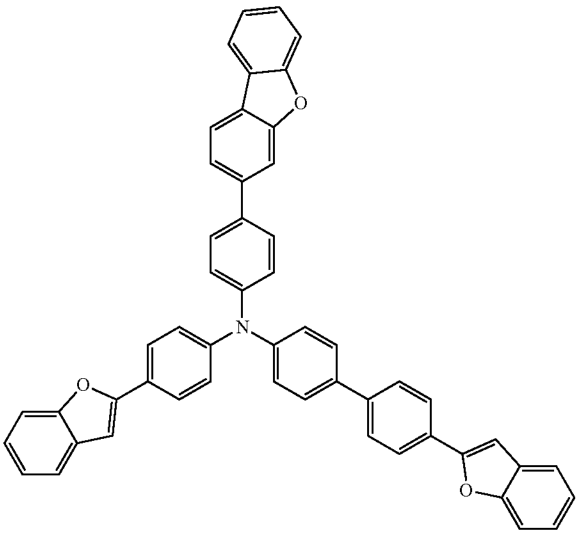

The structure of the obtained yellow powder was identified by NMR.

The $^1$H-NMR ($CDCl_3$) detected 33 hydrogen signals, as follows.

δ (ppm)=8.01-7.93 (4H), 7.81-7.78 (3H), 7.71 (2H), 7.66-7.45 (12H), 7.39-7.21 (10H), 7.01 (1H), 6.96 (1H).

Example 31

<Synthesis of Compound (1-222)>

The same reaction in Example 29 was performed except that (4-benzofuran-2-yl-phenyl)-(4-naphthalene-2-yl-phenyl)amine was replaced with (4-benzofuran-2-yl-phenyl)-(4-benzoxazole-2-yl-phenyl)amine. After the solid was collected, the solid was purified by crystallization with a chlorobenzene/acetone mixed solvent, whereby 8.0 g of a yellow powder of Compound (1-222) (yield: 96%) was obtained.

[Chemical Formula 37]

(1-222)

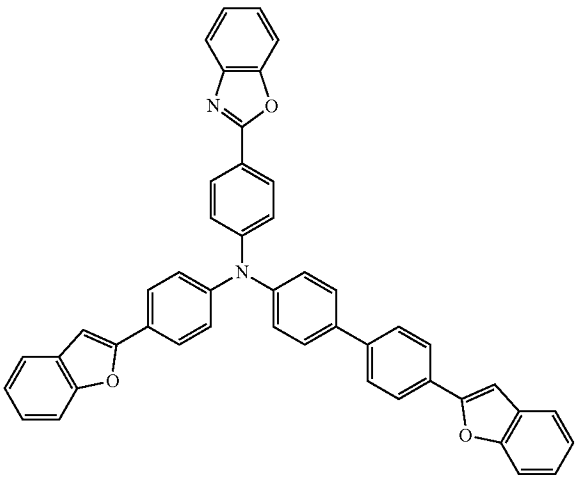

The structure of the obtained yellow powder was identified by NMR.

The $^{1}$H-NMR ($CDCl_3$) detected 30 hydrogen signals, as follows.

δ (ppm)=8.15 (2H), 7.95 (2H), 7.83 (2H), 7.75 (1H), 7.71 (2H), 7.66-7.50 (7H), 7.38-7.21 (12H), 7.07 (1H), 6.98 (1H).

Example 32

Synthesis of Compound (1-223)

To a reaction vessel purged with nitrogen, 5.0 g of (4-benzofuran-2-yl-phenyl)-(4-naphthalene-2-yl-phenyl) amine, 50 mL of xylene, 4.3 g of 2-(4'-chlorobiphenyl-4-yl) benzothiophene, 2.4 g of tert-butoxy sodium, 0.2 g of tris(dibenzylideneacetone)dipalladium, and 0.2 g of a toluene solution containing 50% (w/v) tri-tert-butylphosphine were added, and the mixture was stirred under heating to reflux overnight. After the mixture was cooled to room temperature, methanol was added thereto, and the precipitated solid was collected by filtration. The obtained solid was purified by crystallization with a tetrahydrofuran/acetone mixed solvent, whereby 5.7 g of a yellow powder of Compound (1-223) (yield: 67%) was obtained.

[Chemical Formula 38]

(1-223)

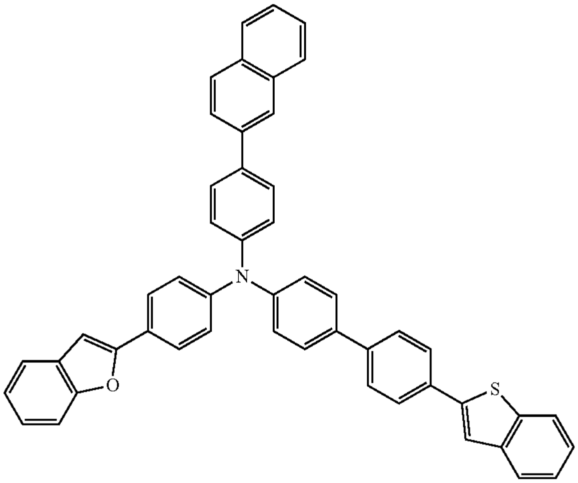

The structure of the obtained yellow powder was identified by NMR.

The $^{1}$H-NMR (DMSO-$d_6$) detected 33 hydrogen signals, as follows.

δ (ppm)=8.24 (1H), 8.02-7.94 (5H), 7.91-7.77 (12H), 7.63 (2H), 7.53 (2H), 7.43-7.21 (11H).

Example 33

<Synthesis of Compound (1-224)>

The same operation as in Example 32 was performed except that (4-benzofuran-2-yl-phenyl)-(4-naphthalene-2-yl-phenyl)amine was replaced with (4-benzofuran-2-yl-phenyl)-(4-dibenzofuran-3-yl-phenyl)amine, whereby 6.6 g of a yellow powder of Compound (1-224) (yield: 77%) was obtained.

[Chemical Formula 39]

(1-224)

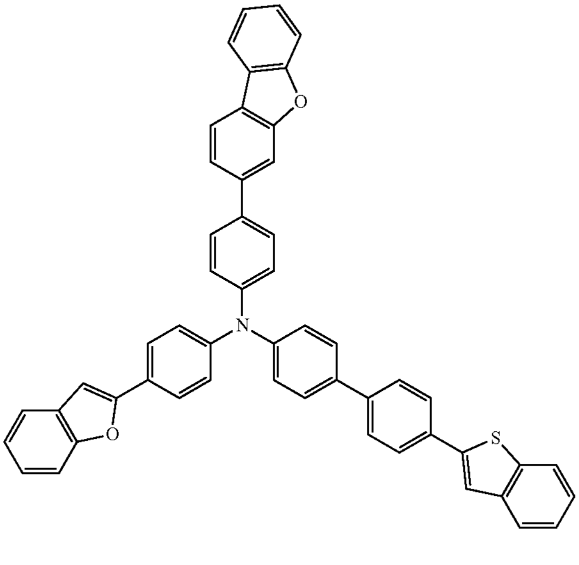

The structure of the obtained yellow powder was identified by NMR.

The $^1$H-NMR ($CDCl_3$) detected 33 hydrogen signals, as follows.

δ (ppm)=8.00 (1H), 7.97 (1H), 7.84 (1H), 7.81-7.78 (6H), 7.68-7.56 (11H), 7.52 (1H), 7.47 (1H), 7.38-7.21 (10H), 6.95 (1H).

Example 34

<Synthesis of Compound (1-225)>

The same reaction in Example 32 was performed except that (4-benzofuran-2-yl-phenyl)-(4-naphthalene-2-yl-phenyl)amine was replaced with (4-benzofuran-2-yl-phenyl)-(4-benzoxazole-2-yl-phenyl)amine. After the solid was collected, the solid was purified by crystallization with a chlorobenzene/acetone mixed solvent, whereby 7.8 g of a yellow powder of Compound (1-225) (yield: 91%) was obtained.

[Chemical Formula 40]

(1-225)

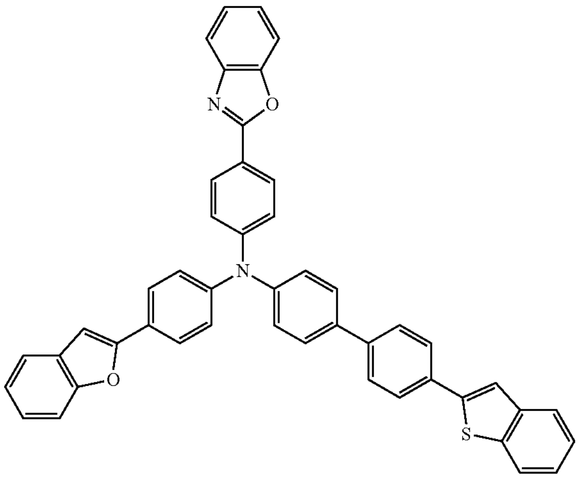

The structure of the obtained yellow powder was identified by NMR.

The $^1$H-NMR ($CDCl_3$) detected 30 hydrogen signals, as follows.

δ (ppm)=8.15 (2H), 7.88-7.77 (6H), 7.75 (1H), 7.67 (2H), 7.64-7.54 (5H), 7.52 (1H), 7.40-7.21 (12H), 6.98 (1H).

Example 35

Synthesis of Compound (1-72)

To a reaction vessel purged with nitrogen, 7.0 g of (4-benzothiophene-2-yl-phenyl)-(4-benzothiazol-2-yl-phenyl)amine, 70 mL of toluene, 6.1 g of 2-(7-bromonaphthrene-2-yl)benzothiophene, 2.3 g of tert-butoxy sodium, 0.4 g of tris(dibenzylideneacetone)dipalladium, and 0.8 g of a toluene solution containing 50% (w/v) tri-tert-butylphosphine were added, and the mixture was stirred under heating to reflux overnight. After the mixture was cooled to room temperature, methanol was added to the mixture, and the precipitated solid was collected by filtration. The obtain solid was purified by recrystallization with chlorobenzene, whereby 7.4 g of a yellow powder of Compound (1-72) (yield: 66%) was obtained.

[Chemical Formula 41]

(1-72)

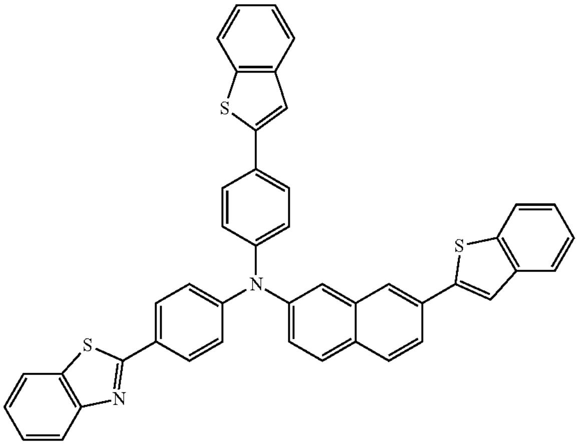

The structure of the obtained yellow powder was identified by NMR.

The $^1$H-NMR ($CDCl_3$) detected 28 hydrogen signals, as follows.

δ (ppm)=8.05 (1H), 8.01 (2H), 7.98 (1H), 7.91-7.77 (8H), 7.69-7.63 (4H), 7.53 (1H), 7.49 (1H), 7.39-7.26 (10H).

Example 36

The glass transition points (Tg) and the melting points of the amine compounds represented by the general formula (1) were determined with a high-sensitivity differential scanning calorimeter (DSC3100SA produced by Bruker AXS). The measurement results are summarized in Table 1.

TABLE 1

| | Compound | Glass transition point (Tg) | Melting point |
|---|---|---|---|
| Example 1 | Compound (1-10) | 132° C. | 301° C. |
| Example 2 | Compound (1-34) | 119° C. | not observed |
| Example 3 | Compound (1-7) | 122° C. | not observed |
| Example 4 | Compound (1-29) | 119° C. | 274° C. |
| Example 5 | Compound (1-32) | 116° C. | 256° C. |
| Example 6 | Compound (1-33) | 117° C. | not observed |
| Example 7 | Compound (1-35) | 123° C. | 257° C. |
| Example 8 | Compound (1-37) | 122° C. | 263° C. |
| Example 9 | Compound (1-39) | 126° C. | 284° C. |
| Example 10 | Compound (1-87) | 157° C. | 297° C. |
| Example 11 | Compound (1-95) | 136° C. | not observed |
| Example 12 | Compound (1-96) | 145° C. | 300° C. |
| Example 13 | Compound (1-211) | 147° C. | 280° C. |
| Example 14 | Compound (1-152) | 100° C. | 247° C. |
| Example 15 | Compound (1-153) | 123° C. | 254° C. |
| Example 16 | Compound (1-154) | 110° C. | 266° C. |
| Example 17 | Compound (1-158) | 109° C. | not observed |
| Example 18 | Compound (1-160) | 115° C. | not observed |
| Example 19 | Compound (1-161) | 118° C. | 250° C. |
| Example 20 | Compound (1-166) | 103° C. | 251° C. |
| Example 21 | Compound (1-212) | 111° C. | not observed |
| Example 22 | Compound (1-213) | 109° C. | not observed |
| Example 25 | Compound (1-216) | 115° C. | 240° C. |
| Example 26 | Compound (1-217) | 126° C. | not observed |
| Example 27 | Compound (1-218) | 118° C. | not observed |
| Example 28 | Compound (1-219) | not observed | 325° C. |
| Example 29 | Compound (1-220) | 116° C. | not observed |
| Example 30 | Compound (1-221) | 125° C. | not observed |
| Example 31 | Compound (1-222) | 123° C. | not observed |
| Example 32 | Compound (1-223) | 121° C. | not observed |
| Example 33 | Compound (1-224) | 130° C. | 270° C. |

TABLE 1-continued

| | Compound | Glass transition point (Tg) | Melting point |
|---|---|---|---|
| Example 34 | Compound (1-225) | 127° C. | 256° C. |
| Example 35 | Compound (1-72) | 131° C. | 271° C. |

As shown above, the amine compounds represented by the general formula (1) preferably used for an organic EL device of the present invention have glass transition points (Tg) of 100° C. or higher, or for which the glass transition point (Tg) is not observed, demonstrating that the compounds have a stable thin-film state.

Example 37

An 80 nm-thick vapor-deposited film was fabricated on a silicon substrate using the amine compound represented by the general formula (1), and the refractive index n and the extinction coefficient k at wavelengths of 450 nm and 750 nm were measured with a spectrometer (F10-RT-UV produced by Filmetrics). For comparison, comparative compounds (2-1) of the following structural formula and $Alq_3$ were also measured (see, for example, PTL 6). The measurement results of the refractive index n and the extinction coefficient k are summarized in Table 2.

[Chemical Formula 42]

(2-1)

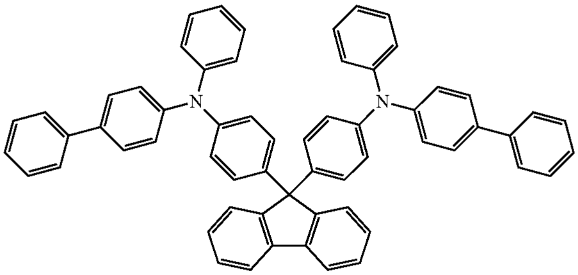

TABLE 2

| | Compound | Refractive index n (λ: 450 nm) | Refractive index n (λ: 750 nm) | Extinction coefficient k (λ: 450 nm) | Extinction coefficient k (λ: 750 nm) |
|---|---|---|---|---|---|
| Example 1 | Compound (1-10) | 2.29 | 1.94 | 0.01 | 0.00 |
| Example 2 | Compound (1-34) | 2.33 | 1.93 | 0.03 | 0.00 |
| Example 3 | Compound (1-7) | 2.34 | 1.91 | 0.04 | 0.00 |
| Example 4 | Compound (1-29) | 2.41 | 1.93 | 0.12 | 0.00 |
| Example 5 | Compound (1-32) | 2.30 | 1.91 | 0.02 | 0.00 |
| Example 6 | Compound (1-33) | 2.37 | 1.92 | 0.01 | 0.00 |
| Example 7 | Compound (1-35) | 2.33 | 1.93 | 0.04 | 0.00 |
| Example 8 | Compound (1-37) | 2.36 | 1.94 | 0.02 | 0.00 |
| Example 9 | Compound (1-39) | 2.32 | 1.93 | 0.02 | 0.00 |
| Example 10 | Compound (1-87) | 2.28 | 1.92 | 0.01 | 0.00 |
| Example 11 | Compound (1-95) | 2.23 | 1.95 | 0.01 | 0.00 |
| Example 12 | Compound (1-96) | 2.27 | 1.94 | 0.00 | 0.00 |
| Example 13 | Compound (1-211) | 2.27 | 1.95 | 0.01 | 0.00 |
| Example 14 | Compound (1-152) | 2.33 | 1.90 | 0.03 | 0.00 |
| Example 15 | Compound (1-153) | 2.28 | 1.91 | 0.00 | 0.00 |
| Example 16 | Compound (1-154) | 2.40 | 1.88 | 0.09 | 0.00 |
| Example 17 | Compound (1-158) | 2.24 | 1.89 | 0.05 | 0.00 |
| Example 18 | Compound (1-160) | 2.36 | 1.92 | 0.02 | 0.00 |
| Example 19 | Compound (1-161) | 2.33 | 1.91 | 0.02 | 0.00 |
| Example 20 | Compound (1-166) | 2.36 | 1.90 | 0.04 | 0.00 |
| Example 21 | Compound (1-212) | 2.25 | 1.88 | 0.06 | 0.00 |
| Example 22 | Compound (1-213) | 2.40 | 1.91 | 0.05 | 0.00 |
| Example 25 | Compound (1-216) | 2.37 | 1.91 | 0.05 | 0.00 |
| Example 26 | Compound (1-217) | 2.38 | 1.92 | 0.02 | 0.00 |
| Example 27 | Compound (1-218) | 2.43 | 1.93 | 0.06 | 0.00 |
| Example 28 | Compound (1-219) | 2.35 | 1.92 | 0.01 | 0.00 |
| Example 29 | Compound (1-220) | 2.36 | 1.92 | 0.02 | 0.00 |
| Example 30 | Compound (1-221) | 2.40 | 1.93 | 0.03 | 0.00 |
| Example 31 | Compound (1-222) | 2.43 | 1.92 | 0.05 | 0.00 |
| Example 32 | Compound (1-223) | 2.36 | 1.93 | 0.02 | 0.00 |
| Example 33 | Compound (1-224) | 2.41 | 1.93 | 0.03 | 0.00 |
| Example 34 | Compound (1-225) | 2.44 | 1.93 | 0.05 | 0.00 |
| Example 35 | Compound (1-72) | 2.41 | 2.10 | 0.00 | 0.00 |
| Comparative Compound 1 | $Alq_3$ | 1.88 | 1.73 | 0.03 | 0.00 |
| Comparative Compound 2 | Comparative Compound (2-1) | 1.84 | 1.77 | 0.00 | 0.00 |

As shown above, the refractive index n of the amine compound represented by the general formula (1) preferably used in the organic EL devices of the present invention is 1.85 or more within a wavelength range of 450 nm or more and 750 nm or less, and has the value higher than the refractive index of the conventional material $Alq_3$ and the comparative compound (2-1). Further the extinction coefficient k is the low value equal to the extinction coefficient of the conventional material $Alq_3$ and the comparative compound (2-1). This indicates that an improvement in light extraction efficiency in the organic EL device can be expected by using the amine compound represented by the general formula (1) preferably used in the organic EL devices of the present invention as a constitutive material of the capping layer.

Example 38

Figure 18:
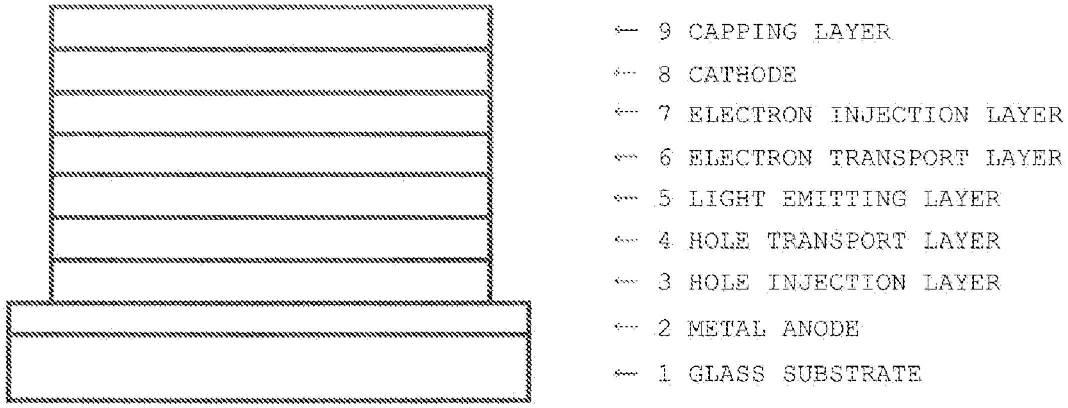
FIG. 18 is a diagram illustrating the configuration of the organic EL devices of Examples 38 to 70 and Comparative Examples 1 to 2.

An organic EL device, as shown in FIG. 18, was fabricated by vapor-depositing a hole injection layer 3, a hole transport layer 4, a light emitting layer 5, an electron transport layer 6, an electron injection layer 7, a cathode 8, and a capping layer 9 in this order on a glass substrate 1 on which a reflective ITO electrode as a metal anode 2 had been formed beforehand.

Specifically, as the metal anode 2, an ITO film with a thickness of 50 nm, a silver alloy reflective film with a thickness of 100 nm, and an ITO film with a thickness of 5 nm were deposited on the glass substrate 1 in this order. After ultrasonic cleaning in isopropyl alcohol for 20 minutes, the assembly was dried on a hot plate heated to 250° C. for 10 minutes. After UV ozone treatment for 2 minutes, the glass substrate with ITO was installed in a vacuum vapor deposition apparatus, and the pressure was reduced to 0.001 Pa or lower.

Subsequently, as the hole injection layer 3 covering the metal anode 2, an electron acceptor (Acceptor-1) of the structural formula below and a compound (3-1) of the structural formula below were formed in a film thickness of nm by dual vapor deposition at a vapor deposition rate ratio Acceptor-1:compound (3-1)=3:97. The hole transport layer 4 was formed on the hole injection layer 3 by forming the compound (3-1) of the structural formula below in a film thickness of 140 nm. The light emitting layer 5 was formed on the hole transport layer 4 in a film thickness of 20 nm by dual vapor deposition of a compound (3-2) of the structural formula below and a compound (3-3) of the structural formula below at a vapor deposition rate ratio of compound (3-2):compound (3-3)=5:95. The electron transport layer 6 was formed on the light emitting layer 5 in a film thickness of 30 nm by dual vapor deposition of a compound (3-4) of the structural formula below and a compound (3-5) of the structural formula below at a vapor deposition rate ratio of compound (3-4):compound (3-5)=50:50. The electron injection layer 7 was formed on the electron transport layer 6 by forming lithium fluoride in a film thickness of 1 nm. On the electron injection layer 7, a magnesium silver alloy was formed as the cathode 8 with a thickness of 12 nm. Finally, the compound (1-10) of Example 1 was formed as the capping layer 9 with a film thickness of 60 nm. The characteristics of the organic EL device thus fabricated were measured in the atmosphere at an ordinary temperature. Table 3 summarizes the results of the emission characteristics measurements performed by applying a DC voltage to the fabricated organic EL device.

[Chemical Formula 43]

(Acceptor-1)

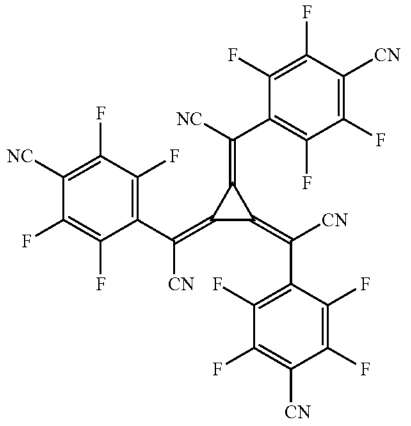

[Chemical Formula 44]

(3-1)

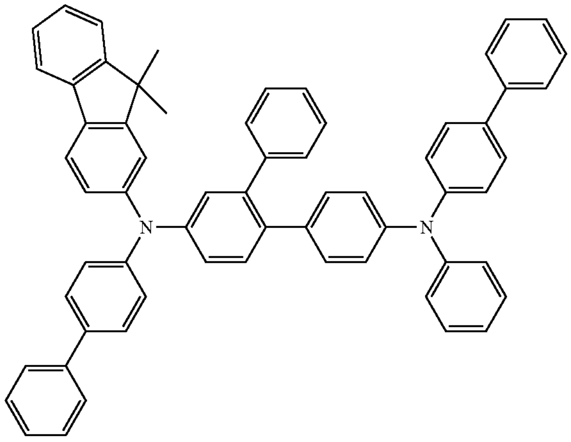

[Chemical Formula 45]

(3-2)

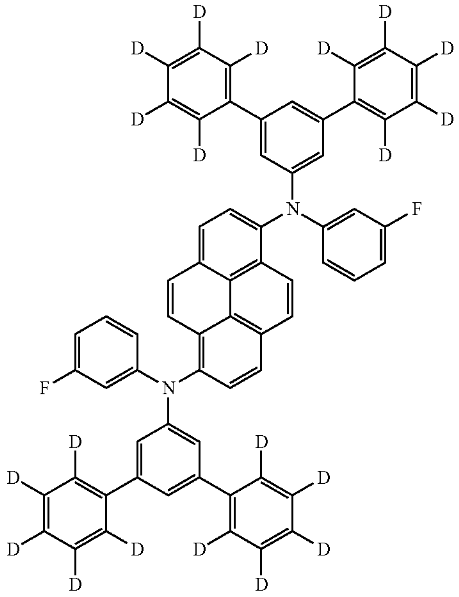

-continued

[Chemical Formula 46]

(3-3)

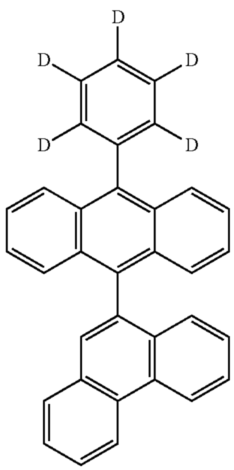

[Chemical Formula 47]

(3-4)

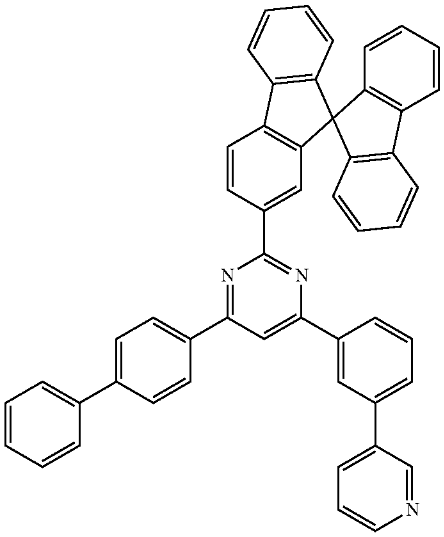

[Chemical Formula 48]

(3-5)

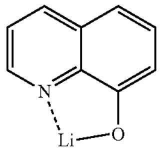

Example 39

An organic EL device was fabricated under the same conditions as in Example 38 except that the capping layer 9 was formed by using the compound (1-34) of Example 2 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 40

An organic EL device was fabricated under the same conditions as in Example 38 except that the capping layer 9 was formed by using the compound (1-7) of Example 3 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 41

An organic EL device was fabricated under the same conditions as in Example 38 except that the capping layer 9 was formed by using the compound (1-29) of Example 4 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 42

An organic EL device was fabricated under the same conditions as in Example 38 except that the capping layer 9 was formed by using the compound (1-32) of Example 5 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 43

An organic EL device was fabricated under the same conditions as in Example 38 except that the capping layer 9 was formed by using the compound (1-33) of Example 6 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 44

An organic EL device was fabricated under the same conditions as in Example 38 except that the capping layer 9 was formed by using the compound (1-35) of Example 7 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 45

An organic EL device was fabricated under the same conditions as in Example 38 except that the capping layer 9 was formed by using the compound (1-37) of Example 8 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 46

An organic EL device was fabricated under the same conditions as in Example 38 except that the capping layer 9 was formed by using the compound (1-39) of Example 9 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 47

An organic EL device was fabricated under the same conditions as in Example 38 except that the capping layer 9 was formed by using the compound (1-87) of Example 10 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 48

An organic EL device was fabricated under the same conditions as in Example 38 except that the capping layer 9 was formed by using the compound (1-95) of Example 11 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 49

An organic EL device was fabricated under the same conditions as in Example 38 except that the capping layer 9 was formed by using the compound (1-96) of Example 12 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 50

An organic EL device was fabricated under the same conditions as in Example 38 except that the capping layer 9 was formed by using the compound (1-211) of Example 13 instead of the compound (1-10) of Example 1. The characteristics of the organic EL device thus fabricated were measured in the atmosphere at an ordinary temperature. Table 3 summarizes the results of the emission characteristics measurements performed by applying a DC voltage to the fabricated organic EL device.

Example 51

An organic EL device was fabricated under the same conditions as in Example 38 except that the capping layer 9 was formed by using the compound (1-152) of Example 14 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 52

An organic EL device was fabricated under the same conditions as in Example 38 except that the capping layer 9 was formed by using the compound (1-153) of Example 15 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 53

An organic EL device was fabricated under the same conditions as in Example 38 except that the capping layer 9 was formed by using the compound (1-154) of Example 16 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 54

An organic EL device was fabricated under the same conditions as in Example 38 except that the capping layer 9 was formed by using the compound (1-158) of Example 17 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 55

An organic EL device was fabricated under the same conditions as in Example 38 except that the capping layer 9 was formed by using the compound (1-160) of Example 18 instead of the compound (1-10) of Example 1. The characteristics of the organic EL device thus fabricated were measured in the atmosphere at an ordinary temperature. Table 3 summarizes the results of the emission characteristics measurements performed by applying a DC voltage to the fabricated organic EL device.

Example 56

An organic EL device was fabricated under the same conditions as in Example 38 except that the capping layer 9 was formed by using the compound (1-161) of Example 19 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 57

An organic EL device was fabricated under the same conditions as in Example 38 except that the capping layer 9 was formed by using the compound (1-166) of Example 20 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 58

An organic EL device was fabricated under the same conditions as in Example 38 except that the capping layer 9 was formed by using the compound (1-212) of Example 21 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 59

An organic EL device was fabricated under the same conditions as in Example 38 except that the capping layer 9 was formed by using the compound (1-213) of Example 22 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 60

An organic EL device was fabricated under the same conditions as in Example 38 except that the capping layer 9 was formed by using the compound (1-216) of Example 25 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 61

An organic EL device was fabricated under the same conditions as in Example 38 except that the capping layer 9 was formed by using the compound (1-217) of Example 26 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 62

An organic EL device was fabricated under the same conditions as in Example 38 except that the capping layer 9 was formed by using the compound (1-218) of Example 27 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 63

An organic EL device was fabricated under the same conditions as in Example 38 except that the capping layer 9 was formed by using the compound (1-219) of Example 28 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 64

An organic EL device was fabricated under the same conditions as in Example 38 except that the capping layer 9 was formed by using the compound (1-220) of Example 29 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 65

An organic EL device was fabricated under the same conditions as in Example 38 except that the capping layer 9 was formed by using the compound (1-221) of Example 30 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 66

An organic EL device was fabricated under the same conditions as in Example 38 except that the capping layer 9 was formed by using the compound (1-222) of Example 31 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 67

An organic EL device was fabricated under the same conditions as in Example 38 except that the capping layer 9 was formed by using the compound (1-223) of Example 32 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 68

An organic EL device was fabricated under the same conditions as in Example 38 except that the capping layer 9 was formed by using the compound (1-224) of Example 33 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 69

An organic EL device was fabricated under the same conditions as in Example 38 except that the capping layer 9 was formed by using the compound (1-225) of Example 34 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Example 70

An organic EL device was fabricated under the same conditions as in Example 38 except that the capping layer 9 was formed by using the compound (1-72) of Example 35 instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Comparative Example 1

For comparison, an organic EL device was fabricated under the same conditions as in Example 38 except that the capping layer 9 was formed by using $Alq_3$ instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Comparative Example 2

For comparison, an organic EL device was fabricated under the same conditions as in Example 38 except that the capping layer 9 was formed by using a comparative compound (2-1) instead of the compound (1-10) of Example 1. The characteristics of the organic EL device thus fabricated were measured in the atmosphere at an ordinary temperature.

Table 3 summarizes the results of the emission characteristics measurements performed by applying a DC voltage to the fabricated organic EL device.

Table 3 summarizes the results of the device lifetime measurements performed with the organic EL devices fabricated in Examples 38 to 70 and Comparative Examples 1 to 2. The device lifetime was measured as the time (attenuation to 95%) taken for the luminance to decay to 95%, with the initial luminance as 100%, when carrying out constant current drive of 10 mA/cm$^2$.

TABLE 3

| | Capping layer | Voltage [V] (@10 mA/cm$^2$) | Luminance [cd/m$^2$] (@10 mA/cm$^2$) | Luminous efficiency [cd/A] (@10 mA/cm$^2$) | Power efficiency [lm/W] (@10 mA/cm$^2$) | Device lifetime attenuation to 95% |
|---|---|---|---|---|---|---|
| Example 38 | Compound (1-10) | 3.66 | 809 | 8.09 | 6.95 | 139 hr. |
| Example 39 | Compound (1-34) | 3.63 | 824 | 8.24 | 7.14 | 144 hr. |
| Example 40 | Compound (1-7) | 3.61 | 806 | 8.06 | 7.02 | 141 hr. |
| Example 41 | Compound (1-29) | 3.61 | 821 | 8.21 | 7.15 | 137 hr. |
| Example 42 | Compound (1-32) | 3.61 | 825 | 8.26 | 7.18 | 157 hr. |
| Example 43 | Compound (1-33) | 3.66 | 840 | 8.41 | 7.22 | 146 hr. |
| Example 44 | Compound (1-35) | 3.65 | 823 | 8.25 | 7.11 | 154 hr. |
| Example 45 | Compound (1-37) | 3.61 | 833 | 8.33 | 7.25 | 151 hr. |
| Example 46 | Compound (1-39) | 3.64 | 824 | 8.25 | 7.12 | 148 hr. |
| Example 47 | Compound (1-87) | 3.66 | 794 | 7.94 | 6.82 | 154 hr. |
| Example 48 | Compound (1-95) | 3.65 | 751 | 7.51 | 6.46 | 165 hr. |
| Example 49 | Compound (1-96) | 3.66 | 775 | 7.76 | 6.66 | 144 hr. |
| Example 50 | Compound (1-211) | 3.65 | 770 | 7.70 | 6.63 | 151 hr. |
| Example 51 | Compound (1-152) | 3.65 | 767 | 7.68 | 6.61 | 138 hr. |
| Example 52 | Compound (1-153) | 3.62 | 779 | 7.80 | 6.76 | 163 hr. |
| Example 53 | Compound (1-154) | 3.64 | 800 | 8.02 | 6.92 | 137 hr. |
| Example 54 | Compound (1-158) | 3.61 | 754 | 7.54 | 6.57 | 143 hr. |
| Example 55 | Compound (1-160) | 3.62 | 810 | 8.11 | 7.04 | 143 hr. |
| Example 56 | Compound (1-161) | 3.73 | 823 | 8.21 | 6.92 | 139 hr. |
| Example 57 | Compound (1-166) | 3.61 | 814 | 8.14 | 7.09 | 163 hr. |
| Example 58 | Compound (1-212) | 3.61 | 759 | 7.59 | 6.61 | 157 hr. |
| Example 59 | Compound (1-213) | 3.66 | 847 | 8.48 | 7.27 | 145 hr. |
| Example 60 | Compound (1-216) | 3.66 | 830 | 8.31 | 7.13 | 159 hr. |
| Example 61 | Compound (1-217) | 3.65 | 817 | 8.17 | 7.03 | 161 hr. |
| Example 62 | Compound (1-218) | 3.60 | 832 | 8.33 | 7.28 | 158 hr. |
| Example 63 | Compound (1-219) | 3.65 | 809 | 8.10 | 6.99 | 140 hr. |
| Example 64 | Compound (1-220) | 3.61 | 818 | 8.18 | 7.12 | 160 hr. |
| Example 65 | Compound (1-221) | 3.67 | 836 | 8.37 | 7.16 | 135 hr. |
| Example 66 | Compound (1-222) | 3.67 | 845 | 8.45 | 7.23 | 165 hr. |
| Example 67 | Compound (1-223) | 3.61 | 817 | 8.17 | 7.12 | 153 hr. |
| Example 68 | Compound (1-224) | 3.64 | 820 | 8.20 | 7.07 | 143 hr. |
| Example 69 | Compound (1-225) | 3.66 | 837 | 8.38 | 7.19 | 139 hr. |
| Example 70 | Compound (1-72) | 3.67 | 834 | 8.34 | 7.15 | 162 hr. |
| Comparative Compound 1 | $Alq_3$ | 3.65 | 714 | 7.14 | 6.15 | 114 hr. |

TABLE 3-continued

| | Capping layer | Voltage [V] (@10 mA/cm$^2$) | Luminance [cd/m$^2$] (@10 mA/cm$^2$) | Luminous efficiency [cd/A] (@10 mA/cm$^2$) | Power efficiency [lm/W] (@10 mA/cm$^2$) | Device lifetime attenuation to 95% |
|---|---|---|---|---|---|---|
| Comparative Compound 2 | Comparative Compound (2-1) | 3.65 | 709 | 7.08 | 6.10 | 121 hr. |

As shown in Table 3, the driving voltage at a current density of 10 mA/cm 2 was almost the same for the devices in Comparative Examples 1 and 2, and Examples 38 to 70 using the amine compounds of the general formula (1) as the capping layers. However, the luminance, the luminous efficiency, the power efficiency, and the device lifetime were significantly improved in the devices of Examples 38 to 70, as compared to the devices of Comparative Examples 1 and 2. This indicates that the amine compound of the general formula (1) preferably used in the organic EL devices of the present invention is a material which is suitably used for the capping layer, and with a high refractive index of the capping layer, therefore the light extraction efficiency of the organic EL devices can be significantly improved.

INDUSTRIAL APPLICABILITY

The amine compound represented by the general formula (1) preferably used in the organic EL devices of the present invention has a high refractive index, which can significantly improve the light extraction efficiency and the stability in thin film state, and therefore is excellent as a compound suitably used in an organic EL device. With the organic EL device fabricated by using the amine compound represented by the general formula (1) preferably used in the organic EL devices of the present invention, a high efficiency can be obtained. The use of the amine compound represented by the general formula (1) preferably used in the organic EL devices of the present invention, which has no absorption in the blue, green, and red wavelength regions, makes it particularly suitable for displaying clear, bright images with good color purity. For example, it is now possible to develop applications in home appliances and lighting.

REFERENCE SIGN LIST

1 Glass substrate
2 Metal anode
3 Hole injection layer
4 Hole transport layer
5 Light emitting layer
6 Electron transport layer
7 Electron injection layer
8 Cathode
9 Capping layer

The invention claimed is:

1. An organic electroluminescent device in this order including at least an anode electrode, a hole transport layer, a light emitting layer, an electron transport layer, a cathode electrode, and a capping layer, and the organic electroluminescent device containing an amine compound as a material of the capping layer represented by the following general formula (1):

[Chemical Formula 1]

(1)

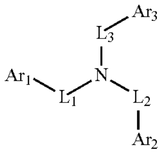

wherein $Ar_1$ and $Ar_2$ may be the same or different, each has a structure represent by the following general formula (A), and represents a monovalent group having a bonding site at any one of $R_5$ and $R_6$, $Ar_3$ has a structure represented by the following general formula (A), and represents a monovalent group having a bonding site at any one of $R_5$ and $R_6$, a substituted or unsubstituted aromatic hydrocarbon group or a substituted or unsubstituted aromatic heterocyclic group, $L_1$ and $L_2$ may be the same or different, each represents a divalent group of a substituted or unsubstituted aromatic hydrocarbon group of 6 to 18 ring-forming carbon atoms, or a divalent group of a substituted or unsubstituted aromatic heterocyclic group of 6 to 18 ring-forming carbon atoms, $L_3$ represents a divalent group of a substituted or unsubstituted aromatic hydrocarbon group of 6 to 18 ring-forming carbon atoms, a divalent group of a substituted or unsubstituted aromatic heterocyclic group of 6 to 18 ring-forming carbon atoms, or a single bond,

[Chemical Formula 2]

(A)

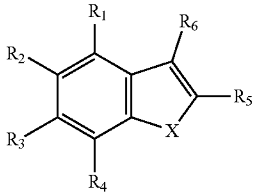

wherein X represents an oxygen atom, or a sulfur atom, $R_1$ to $R_4$ may be the same or different, each represents a hydrogen atom, a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, or a substituted or unsubstituted aryloxy group, $R_1$ to $R_4$ bonded to the same benzene ring may bind to each other via a single bond, a substituted or unsubstituted methylene group, an oxygen atom, or a sulfur atom to form a ring, One of $R_5$ and $R_6$ represents a linking group as a bonding site, a hydrogen atom, a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, or a substituted or unsubstituted aromatic heterocyclic group.

2. The organic electroluminescent device according to claim 1, wherein the general formula (A) has a structure represented by the following general formula (A-1):

[Chemical Formula 3]

(A-1)

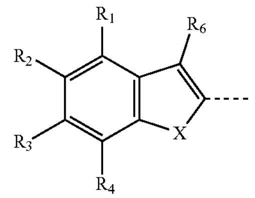

wherein the dashed part is the binding site, X, $R_1$ to $R_4$, and $R_6$ are the same as defined by the general formula (A).

3. The organic electroluminescent device according to claim 1, wherein the general formula (A) has a structure represented by the following general formula (A-2):

[Chemical Formula 4]

(A-2)

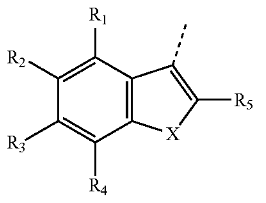

wherein the dashed part is the binding site, X, and $R_1$ to $R_5$ $R_6$ are the same as defined by the general formula (A).

4. The organic electroluminescent device according to claim 1, wherein $L_1$ and $L_2$ in the general formula (1) are divalent groups that result from the removal of two hydrogen atoms from unsubstituted benzene, divalent groups that result from the removal of two hydrogen atoms from unsubstituted naphthalene, or divalent groups that result from the removal of two hydrogen atoms from unsubstituted biphenyl.

5. The organic electroluminescent device according to claim 1, wherein the amine compound represented by the general formula (1) is represented by the following general formula (1-a):

[Chemical Formula 5]

(1-a)

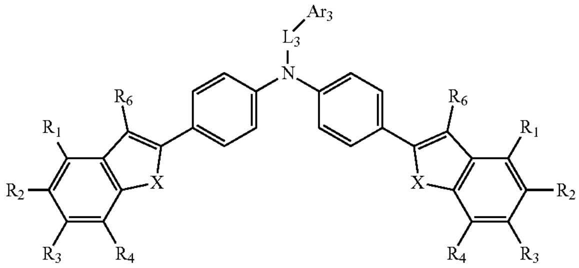

wherein X, $Ar_3$, $L_3$, $R_1$ to $R_4$, and $R_6$ are the same as defined by the general formula (1) and the general formula (A).

6. The organic electroluminescent device according to claim 1, wherein the amine compound represented by the general formula (1) is represented by the following general formula (1-b),

[Chemical Formula 6]

(1-b)

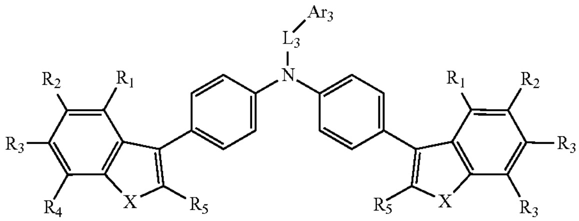

wherein X, $Ar_3$, $L_3$, and $R_1$ to $R_5$ are the same as defined by the general formula (1) and the general formula (A).

7. The organic electroluminescent device according to claim 1, wherein the thickness of the capping layer is within a range of 30 nm to 120 nm.

8. The organic electroluminescent device according to claim 1, wherein the refractive index of the capping layer is 1.85 or more within a wavelength range of 450 nm or more and 750 nm or less.

9. An electronic apparatus comprising the organic electroluminescent device according to claim 1.

10. The organic electroluminescent device according to claim 2, wherein the thickness of the capping layer is within a range of 30 nm to 120 nm.

11. The organic electroluminescent device according to claim 3, wherein the thickness of the capping layer is within a range of 30 nm to 120 nm.

12. The organic electroluminescent device according to claim 4, wherein the thickness of the capping layer is within a range of 30 nm to 120 nm.

13. The organic electroluminescent device according to claim 5, wherein the thickness of the capping layer is within a range of 30 nm to 120 nm.

14. The organic electroluminescent device according to claim 2, wherein the refractive index of the capping layer is 1.85 or more within a wavelength range of 450 nm or more and 750 nm or less.

15. The organic electroluminescent device according to claim 3, wherein the refractive index of the capping layer is 1.85 or more within a wavelength range of 450 nm or more and 750 nm or less.

16. The organic electroluminescent device according to claim 4, wherein the refractive index of the capping layer is 1.85 or more within a wavelength range of 450 nm or more and 750 nm or less.

17. The organic electroluminescent device according to claim 5, wherein the refractive index of the capping layer is 1.85 or more within a wavelength range of 450 nm or more and 750 nm or less.

18. An electronic apparatus comprising the organic electroluminescent device according to claim 2.

19. An electronic apparatus comprising the organic electroluminescent device according to claim 3.

20. An electronic apparatus comprising the organic electroluminescent device according to claim 4.

* * * * *